US012575090B2

(12) United States Patent
Cho et al.

(10) Patent No.: US 12,575,090 B2
(45) Date of Patent: Mar. 10, 2026

(54) SEMICONDUCTOR DEVICE AND METHOD OF MANUFACTURING THE SAME

(71) Applicant: Samsung Electronics Co., Ltd., Suwon-si (KR)

(72) Inventors: Byunghoon Cho, Yongin-si (KR); Namjung Kang, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 670 days.

(21) Appl. No.: 17/946,812

(22) Filed: Sep. 16, 2022

(65) Prior Publication Data

US 2023/0093872 A1 Mar. 30, 2023

(30) Foreign Application Priority Data

Sep. 23, 2021 (KR) ........................ 10-2021-0125871

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02)

(58) Field of Classification Search
CPC ............... H10B 12/033; H10B 12/318; H10B 12/0335; H10B 12/09; H10D 1/716
See application file for complete search history.

(56) References Cited

U.S. PATENT DOCUMENTS

| | | |
|---|---|---|
| 6,965,139 B2 | 11/2005 | Ohno |
| 7,879,681 B2 * | 2/2011 | Kim .................... H01L 23/5223 |
| | | 438/396 |
| 8,008,185 B2 | 8/2011 | Kim |

(Continued)

FOREIGN PATENT DOCUMENTS

| | | |
|---|---|---|
| KR | 10-2009-0103148 A | 10/2009 |
| KR | 101096210 B1 | 12/2011 |

(Continued)

OTHER PUBLICATIONS

Taiwanese Office Action dated Aug. 16, 2023 issued in Taiwanese Patent Application No. 111135653.

(Continued)

*Primary Examiner* — Edward Chin
(74) *Attorney, Agent, or Firm* — Harness, Dickey & Pierce, P.L.C.

(57) ABSTRACT

A semiconductor device including a substrate including a cell area and a peripheral circuit area, a plurality of cell transistors in the cell area, a peripheral circuit in the peripheral circuit area, a first etch stop film covering the cell transistors, a second etch stop film covering the peripheral circuit and defining a bottom plug space passing therethrough, a capacitor structure in the cell area and including lower electrodes passing through the first etch stop film and respectively connected to the cell transistors, a peripheral circuit contact in the peripheral circuit area, the peripheral circuit contact passing through the second etch stop film and electrically connected to the peripheral circuit, and an insulating liner on a side wall portion of the second etch stop film defining the bottom plug space, the insulating liner surrounding a portion of a side wall of the peripheral circuit contact may be provided.

20 Claims, 28 Drawing Sheets

(56) References Cited

U.S. PATENT DOCUMENTS

| | | | |
|---|---|---|---|
| 8,878,272 B2 | 11/2014 | Kim | |
| 10,128,252 B2 | 11/2018 | Lee et al. | |
| 10,804,277 B2 | 10/2020 | Kim et al. | |
| 11,018,012 B2 | 5/2021 | Wang et al. | |
| 2003/0052350 A1* | 3/2003 | Ohno | H10B 12/318 |
| | | | 257/296 |
| 2010/0087042 A1* | 4/2010 | Kim | H01L 23/5223 |
| | | | 438/396 |
| 2012/0205733 A1 | 8/2012 | Kang | |
| 2014/0327056 A1* | 11/2014 | Park | H01L 21/28044 |
| | | | 257/288 |
| 2018/0158727 A1 | 6/2018 | Hsieh et al. | |
| 2019/0164976 A1* | 5/2019 | Kim | H01L 21/31116 |
| 2020/0098572 A1* | 3/2020 | Wang | H01L 21/28562 |
| 2022/0189966 A1 | 6/2022 | Jang et al. | |

FOREIGN PATENT DOCUMENTS

| | | | |
|---|---|---|---|
| KR | 101386434 B1 | 4/2014 | |
| KR | 10-2014-0130594 A | 11/2014 | |
| KR | 2022-0083386 A | 6/2022 | |
| TW | 449882 B | 8/2001 | |
| TW | 202013466 A | 4/2020 | |

OTHER PUBLICATIONS

Korean Office Action dated Apr. 15, 2025 issued in Korean Patent Application No. 10-2021-0125871.

* cited by examiner

SEMICONDUCTOR DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2021-0125871, filed on Sep. 23, 2021, in the Korean Intellectual Property Office, the disclosure of which is incorporated by reference herein in its entirety.

BACKGROUND

The inventive concepts relate to semiconductor devices and/or methods of manufacturing the same, and more particularly, to semiconductor devices including a cell capacitor and/or methods of manufacturing the semiconductor device.

With the down-scaling of semiconductor devices, the size of an individual micro-pattern of a semiconductor device has been decreased. When the size of an individual micro-pattern decreases, the height of a cell capacitor and the height of a peripheral circuit contact also increase, and accordingly, a misalignment or the like may occur in a process of forming the peripheral circuit contact.

SUMMARY

Some example embodiments of the inventive concepts provide semiconductor devices capable of mitigating or preventing a misalignment of a peripheral circuit contact.

Some example embodiments of the inventive concepts provide methods of manufacturing a semiconductor device capable of preventing a misalignment of a peripheral circuit contact.

According to an aspect of the inventive concepts, a semiconductor device includes a substrate including a cell area and a peripheral circuit area, the peripheral circuit area being on at least one side of the cell area, a plurality of cell transistors in the cell area, a peripheral circuit in the peripheral circuit area, a first etch stop film covering the plurality of cell transistors in the cell area, a second etch stop film covering the peripheral circuit in the peripheral circuit area, the second etch stop film defining a bottom plug space passing therethrough, a capacitor structure in the cell area, the capacitor structure including a plurality of lower electrodes, the plurality of lower electrodes passing through the first etch stop film and connected to the plurality of cell transistors, respectively, a peripheral circuit contact in the peripheral circuit area, the peripheral circuit contact passing through the second etch stop film and being electrically connected to the peripheral circuit, and an insulating liner on a side wall portion of the second etch stop film defining the bottom plug space, the insulating liner surrounding at least a portion of a side wall of the peripheral circuit contact.

According to another aspect of the inventive concepts, a semiconductor device includes a substrate including a cell area and a peripheral circuit area, the peripheral circuit area being on at least one side of the cell area, a plurality of cell transistors in the cell area, a peripheral circuit in the peripheral circuit area, a first etch stop film covering the plurality of cell transistors in the cell area, the first etch stop film having a first height in a vertical direction perpendicular to a top surface of the substrate, a second etch stop film covering the peripheral circuit in the peripheral circuit area, a capacitor structure in the cell area, the capacitor structure including a plurality of lower electrodes passing through the first etch stop film and connected to the plurality of cell transistors, respectively, a peripheral circuit contact in the peripheral circuit area, the peripheral circuit contact passing through the second etch stop film, electrically connected to the peripheral circuit, and including a main contact portion and a bottom plug connected to a bottom portion of the main contact portion, and an insulating liner surrounding a side wall of the bottom plug, wherein the bottom plug has a second height in the vertical direction, is the second height being greater than the first height.

According to a further aspect of the inventive concepts, a semiconductor device includes a substrate including a cell area and a peripheral circuit area, the peripheral circuit area being on at least one side of the cell area, a bit line structure in the cell area, a conductive plug at a side of the bit line structure, the conductive plug being electrically connected to the substrate, a landing pad on the conductive plug, the landing pad extending in a vertical direction, is the vertical direction being perpendicular to a top surface of the substrate, a first etch stop film covering the landing pad in the cell area, a lower electrode in the cell area, the lower electrode passing through the first etch stop film, connected to the landing pad, and extending in the vertical direction, a peripheral circuit in the peripheral circuit area, a contact pad in the peripheral circuit area, the contact pad electrically connected to the peripheral circuit, a second etch stop film covering the contact pad in the peripheral circuit area, a peripheral circuit contact in the peripheral circuit area, the peripheral circuit contact passing through the second etch stop film, electrically connected to the peripheral circuit, and including a main contact portion and a bottom plug connected to a bottom portion of the main contact portion, and an insulating liner surrounding a side wall of the bottom plug.

BRIEF DESCRIPTION OF THE DRAWINGS

Some example embodiments of the inventive concepts will be more clearly understood from the following detailed description taken in conjunction with the accompanying drawings, in which:

FIGS. 6 to 28 are cross-sectional views showing stages of a method of manufacturing a semiconductor device, according to an example embodiment.

DETAILED DESCRIPTION

Hereinafter, example embodiments are described in detail with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
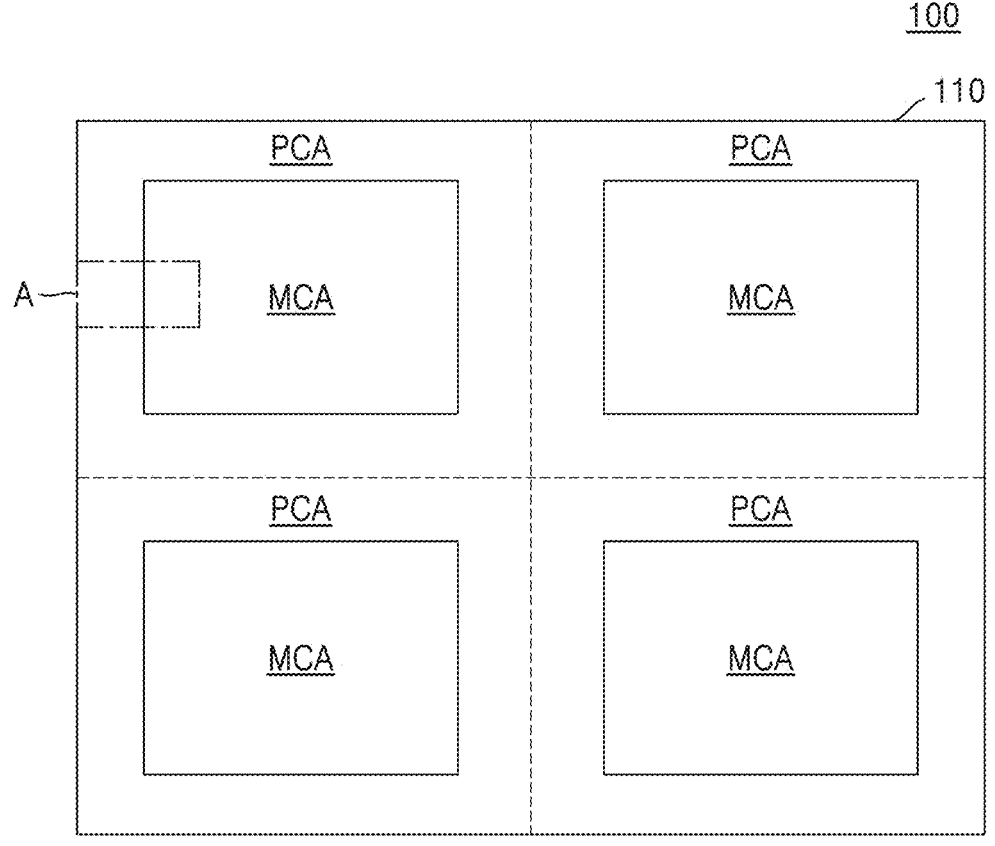
FIG. 1 is a layout diagram of a semiconductor device according to an example embodiment.
Figure 2:
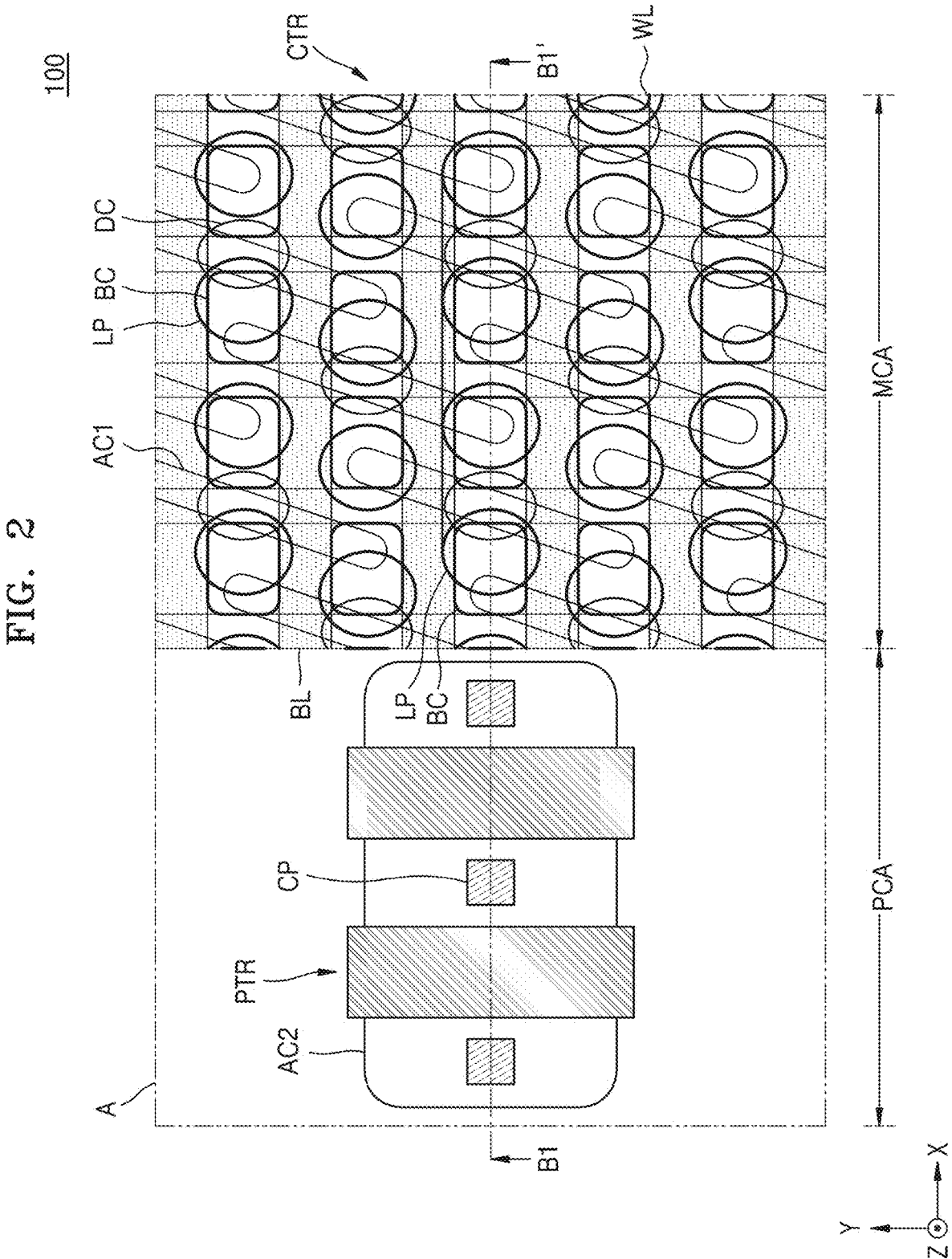
FIG. 2 is an enlarged layout diagram of a region A in FIG. 1.
Figure 3:
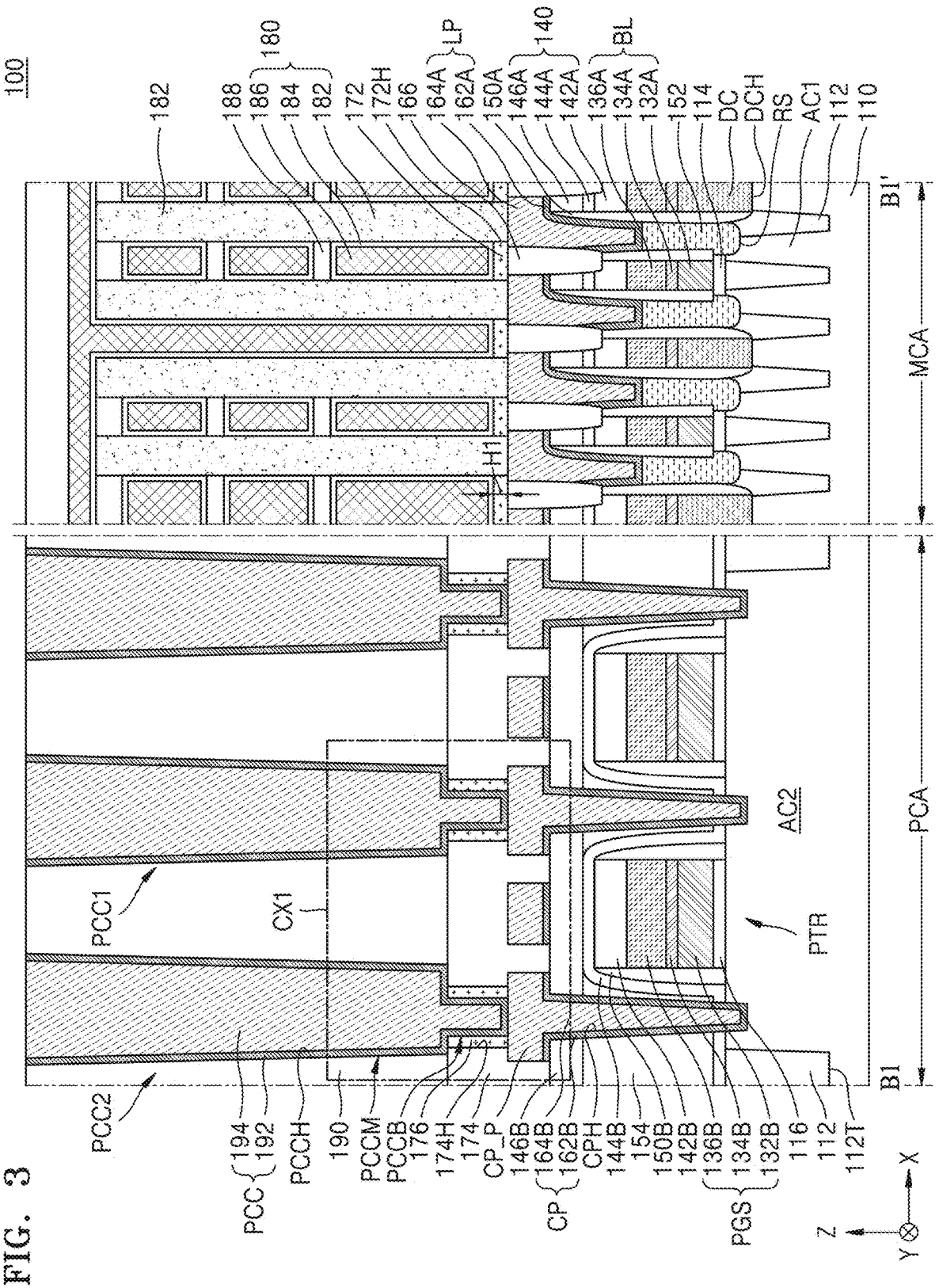
FIG. 3 is a cross-sectional view taken along a line B1-B1' in FIG. 2.
Figure 4:
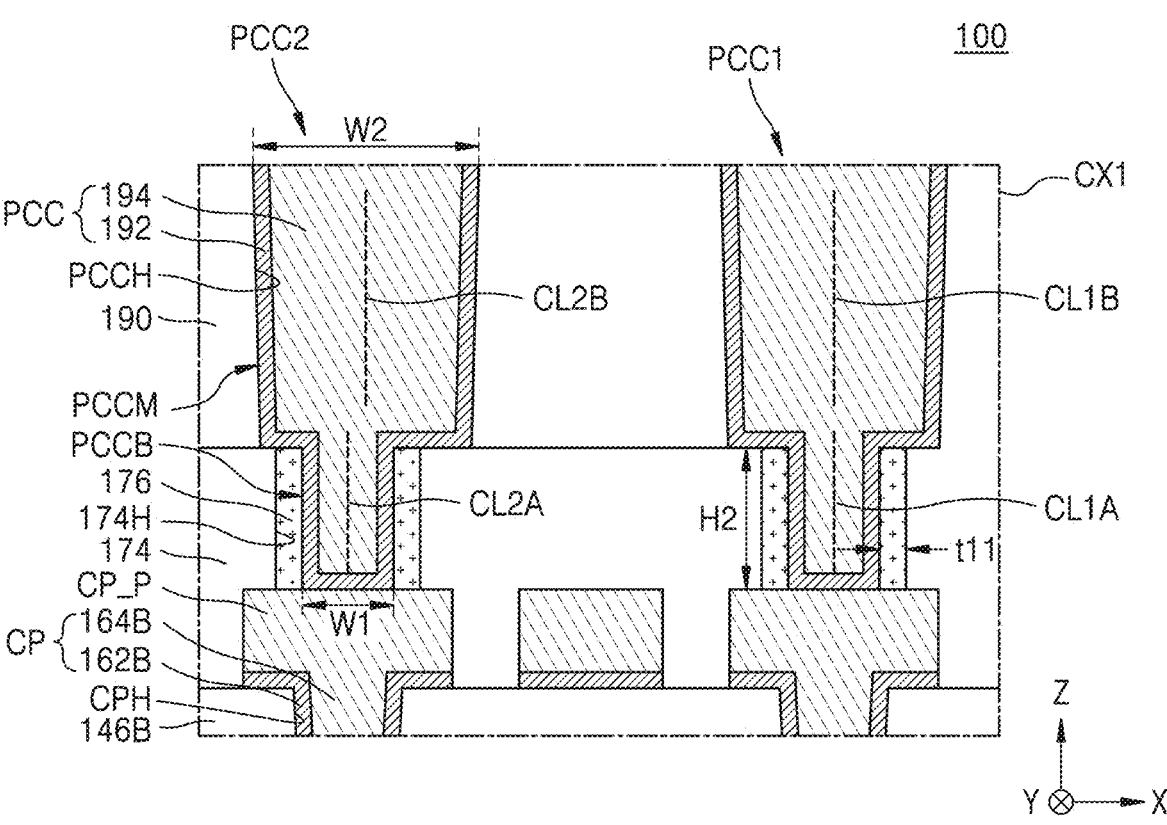
FIG. 4 is an enlarged cross-sectional view of a region CX1 in FIG. 3.

FIG. 1 is a layout diagram of a semiconductor device 100 according to an example embodiment. FIG. 2 is an enlarged layout diagram of a region A in FIG. 1. FIG. 3 is a cross-sectional view taken along a line B1-B1' in FIG. 2. FIG. 4 is an enlarged cross-sectional view of a region CX1 in FIG. 3.

Referring to FIGS. 1 to 4, the semiconductor device 100 may include a substrate 110 including a cell array area MCA and a peripheral circuit area PCA. The cell array area MCA may correspond to a memory cell area of a dynamic random access memory (DRAM) device, and the peripheral circuit area PCA may correspond to a core area or peripheral circuit area of the DRAM device. For example, the cell array area MCA may include a cell transistor CTR and a capacitor structure 180 connected to the cell transistor CTR, and the peripheral circuit area PCA may include a peripheral circuit transistor PTR, which transmits a signal and/or power to the cell transistor CTR included in the cell array area MCA. In some example embodiments, the peripheral circuit transistor PTR may form any one of various circuits such as a command decoder, a control logic, an address buffer, a row decoder, a column decoder, a sense amplifier, and a data input/output circuit.

A device isolation trench 112T may be formed in the substrate 110, and a device isolation film 112 may be formed in the device isolation trench 112T. A plurality of first active regions AC1 may be defined by the device isolation film 112 in the cell array area MCA of the substrate 110, and a second active region AC2 may be defined in the peripheral circuit area PCA of the substrate 110.

Each of the first active regions AC1 in the cell array area MCA may be arranged to have a long axis in a diagonal direction to a first horizontal direction X and a second horizontal direction Y. A plurality of word lines WL may extend across the first active regions AC1 in parallel with each other along the first horizontal direction X. A plurality of bit lines BL may extend above the word lines WL in parallel with each other along the second horizontal direction Y. The bit lines BL may be connected to the first active regions AC1 through a direct contact DC.

A plurality of buried contacts BC may be formed between two adjacent bit lines BL among the bit lines BL. The buried contacts BC may be arranged in line in the first horizontal direction X and the second horizontal direction Y. A plurality of landing pads LP may be formed on the buried contacts BC. The buried contacts BC and the landing pads LP may connect a lower electrode 182 of the capacitor structure 180, which is formed above the bit lines BL, to the first active region AC1. Each of the landing pads LP may partially overlap with a buried contact BC.

The substrate 110 may include silicon, for example, monocrystalline silicon, polycrystalline silicon, or amorphous silicon. In some example embodiments, the substrate 110 may include at least one selected from Ge, SiGe, SiC, GaAs, InAs, and InP. In some example embodiments, the substrate 110 may include a conductive region (e.g., an impurity-doped well or an impurity-doped structure). The device isolation film 112 may include an oxide film, a nitride film, or a combination thereof.

In the cell array area MCA, a plurality of word line trenches (not shown) extending in the first horizontal direction X are formed in the substrate 110, and a plurality of gate dielectric films (not shown), gate electrodes (not shown), and capping insulation films (not shown) are formed in the word line trenches. The gate electrodes may correspond to the word lines WL in FIG. 2. The gate dielectric films may include a silicon oxide film, a silicon nitride film, a silicon oxynitride film, an oxide/nitride/oxide (ONO) film, or a high-k dielectric film having a higher dielectric constant than a silicon oxide film. The gate electrodes may include Ti, TiN, Ta, TaN, W, WN, TiSiN, WSiN, or a combination thereof. The capping insulation films may include a silicon oxide film, a silicon nitride film, a silicon oxynitride film, or a combination thereof.

In the cell array area MCA, a buffer film 114 may be formed on the substrate 110. The buffer film 114 may include an oxide film, a nitride film, or a combination thereof.

A plurality of direct contacts DC may be formed in a plurality of direct contact holes DCH in the substrate 110. The direct contacts DC may be connected to the first active regions AC1. The direct contacts DC may include doped polysilicon. For example, the direct contacts DC may include polysilicon that includes N-type impurities, such as phosphorous (P), arsenic (As), bismuth (Bi), and antimony (Sb), at a relatively high concentration.

The bit lines BL may extend in the second horizontal direction Y above the substrate 110 and the direct contacts DC. Each of the bit lines BL may be connected to the first active region AC1 through a direct contact DC. Each of the bit lines BL may include a lower conductive pattern 132A, a middle conductive pattern 134A, and an upper conductive pattern 136A, which are sequentially stacked on the substrate 110. The lower conductive pattern 132A may include doped polysilicon. The middle conductive pattern 134A and the upper conductive pattern 136A may include TiN, TiSiN, W, tungsten silicide, or a combination thereof. In some example embodiments, the middle conductive pattern 134A may include TiN, TiSiN, or a combination thereof, and the upper conductive pattern 136A may include W.

The bit lines BL may be respectively covered with a plurality of insulating capping structures 140. The insulating capping structures 140 may extend in the second horizontal direction Y on the bit lines BL. Each of the insulating capping structures 140 may include a lower capping pattern 142A, a protective layer pattern 144A, and an upper capping pattern 146A.

A spacer 150A may be on both side walls of each of the bit lines BL. The spacer 150A may extend in the second horizontal direction Y on both side walls of a bit line BL, and a portion of the spacer 150A may extend into a direct contact hole DCH and cover both side walls of the direct contact DC. It is illustrated in FIG. 3 that the spacer 150A is a single material layer. However, in some example embodiments, the spacer 150A may have a stack structure of multiple spacer layers (not shown), and at least one of the spacer layers may be an air spacer.

The direct contact DC may be formed in the direct contact hole DCH in the substrate 110 and extend to a higher level than the top surface of the substrate 110. For example, the top surface of the direct contact DC may be at the same level as the top surface of the lower conductive pattern 132A and in contact with the bottom surface of the middle conductive pattern 134A. The bottom surface of the direct contact DC may be at a lower level than the top surface of the substrate 110.

A plurality of insulating fences (not shown) and a plurality of conductive plugs 152 may be arranged in line in the second horizontal direction Y among the bit lines BL. Each of the insulating fences may be on the capping insulation film in an upper portion of a word line trench, and each of the conductive plugs 152 may extend long in a vertical direction Z from a recess RS in the substrate 110. Both side walls of each of the conductive plugs 152 may be insulated from each other in the second horizontal direction Y by a plurality of insulating fences. The conductive plugs 152 may form the buried contacts BC in FIG. 2.

The landing pads LP may be formed on the conductive plugs 152. Although not shown, a metal silicide film (not shown) may be between the conductive plugs 152 and the landing pads LP. The metal silicide film may include cobalt silicide, nickel silicide, or manganese silicide. Each of the landing pads LP may include a conductive barrier film 162A and a landing pad conductive layer 164A. The conductive barrier film 162A may include Ti, TiN, or a combination thereof. The landing pad conductive layer 164A may include a metal, a metal nitride, conductive polysilicon, or a combination thereof. For example, the landing pad conductive layer 164A may include tungsten (W). The landing pads LP may be formed in islands pattern in a plan view. The landing pads LP may be electrically insulated from each other by an insulating pattern 166 surrounding each of the landing pads LP. The insulating pattern 166 may include at least one selected from silicon nitride, silicon oxide, and silicon oxynitride.

In the cell array area MCA, a first etch stop layer 172 may be on a landing pad LP and the insulating pattern 166. The first etch stop layer 172 may include an opening 172H. The opening 172H may be located in correspondence to the top surface of the landing pad LP. In some example embodiments, the first etch stop layer 172 may include a material having an etch selectivity with respect to the insulating pattern 166. For example, the first etch stop layer 172 may include silicon boron nitride (SiBN). The first etch stop layer 172 may have a first height H1 of about 10 angstroms to about 100 angstroms in the vertical direction Z but is not limited thereto.

In the cell array area MCA, the capacitor structure 180 may be on the first etch stop layer 172. The capacitor structure 180 may include a plurality of lower electrodes 182, a capacitor dielectric layer 184, and an upper electrode 186.

The lower electrodes 182 may pass through the first etch stop layer 172 and respectively extend in the vertical direction Z on the landing pads LP. A bottom portion of each of the lower electrodes 182 may be in the opening 172H of the first etch stop layer 172. A support layer 188 may be on a side wall of each of the lower electrodes 182. The support layer 188 may allow a certain distance to be kept between two adjacent lower electrodes 182 and mitigate or prevent the lower electrodes 182 from tilting or collapsing in a stage of forming the lower electrodes 182. A plurality of support layers 188 may be formed on the side wall of each of the lower electrodes 182 at different levels in the vertical direction Z.

The capacitor dielectric layer 184 may be on the lower electrodes 182. The capacitor dielectric layer 184 may extend from respective side walls of the lower electrodes 182 to the top and bottom surface of each of the support layers 188 and to the top surface of the first etch stop layer 172. The upper electrode 186 may be on the capacitor dielectric layer 184 and cover the lower electrodes 182.

In some example embodiments, the capacitor dielectric layer 184 may include at least one selected from zirconium oxide, hafnium oxide, titanium oxide, niobium oxide, tantalum oxide, yttrium oxide, strontium titanium oxide, barium strontium titanium oxide, scandium oxide, and lanthanum oxide. The lower electrodes 182 and the upper electrode 186 include at least one selected from a metal such as ruthenium (Ru), titanium (Ti), tantalum (Ta), niobium (Nb), iridium (Ir), molybdenum (Mo), and tungsten (W), a conductive metal nitride such as titanium nitride (TiN), tantalum nitride (TaN), niobium nitride (NbN), molybdenum nitride (MoN), and tungsten nitride (WN), and a conductive metal oxide such as iridium oxide ($IrO_2$), ruthenium oxide ($RuO_2$), and strontium ruthenium oxide ($SrRuO_3$).

In some example embodiments, each of the lower electrodes 182 may have a pillar shape extending in the vertical direction Z and a circular horizontal cross-section. However, the horizontal cross-section of each of the lower electrodes 182 is not limited to a circular shape and may have various polygonal or rounded polygonal shapes such as an oval, a quadrangle, a rounded quadrangle, a diamond, and a trapezoid. It is illustrated in FIG. 3 that each of the lower electrodes 182 has a pillar shape having a circular horizontal cross-section throughout the full height thereof. However, in some example embodiments, each of the lower electrodes 182 may have a cylindrical shape with the closed bottom.

In the peripheral circuit area PCA, the peripheral circuit transistor PTR may be on the second active region AC2. The peripheral circuit transistor PTR may include a gate dielectric film 116, a peripheral circuit gate electrode PGS, and a gate capping pattern 142B, which are sequentially stacked on the second active region AC2.

The gate dielectric film 116 may include at least one selected from a silicon oxide film, a silicon nitride film, a silicon oxynitride film, an ONO film, and a high-k dielectric film having a higher dielectric constant than a silicon oxide film. The peripheral circuit gate electrode PGS may include a lower conductive pattern 132B, a middle conductive pattern 134B, and an upper conductive pattern 136B. The respective materials of the lower conductive pattern 132B, the middle conductive pattern 134B, and the upper conductive pattern 136B may be respectively the same as the respective materials of the lower conductive pattern 132A, the middle conductive pattern 134A, and the upper conductive pattern 136A of a bit line BL in the cell array area MCA. The gate capping pattern 142B may include a silicon nitride film.

Both side walls of each of the peripheral circuit gate electrode PGS and the gate capping pattern 142B may be covered with an insulating spacer 150B. The insulating spacer 150B may include an oxide film, a nitride film, or a combination thereof. The peripheral circuit transistor PTR and the insulating spacer 150B may be covered with a protective layer 144B. A first interlayer insulation film 154 may be formed on the protective layer 144B and fill a space between two adjacent peripheral circuit transistors PTR. The top surface of the first interlayer insulation film 154 may be coplanar with the top surface of the protective layer 144B on the top surface of a peripheral circuit transistor PTR. A capping insulating layer 146B may be on the first interlayer insulation film 154 and the protective layer 144B.

In the peripheral circuit area PCA, a contact plug CP may be formed in a contact hole CPH, which passes through the first interlayer insulation film 154 and the capping insulating layer 146B in the vertical direction Z. Similarly to the landing pads LP in the cell array area MCA, the contact plug CP may include a conductive barrier film 162B and a landing pad conductive layer 164B. A metal silicide film (not shown) may be between the second active region AC2 and the contact plug CP. A contact pad CP_P connected to the contact plug CP may be on the capping insulating layer 146B. As shown in FIG. 3, the contact pad CP_P may be integrally formed with the contact plug CP and horizontally extend on the capping insulating layer 146B.

A second etch stop layer 174 covering the contact pad CP_P may be on the capping insulating layer 146B. The second etch stop layer 174 may fill a space between adjacent contact pads CP_P and have a relatively flat top surface. In some example embodiments, the second etch stop layer 174 may have a stack structure of multiple material layers. The second etch stop layer 174 may have a bottom plug space 174H, and the top surface of the contact pad CP_P may be exposed in a bottom portion of the bottom plug space 174H.

The second etch stop layer 174 may have a greater height than the first height H1 of the first etch stop layer 172 in the vertical direction Z. For example, the height of the second etch stop layer 174 may be about 100 angstroms to about 800 angstroms but is not limited thereto.

An insulating liner 176 may be on a side wall portion of the second etch stop layer 174 defining the bottom plug space 174H of the second etch stop layer 174. The insulating liner 176 may include the same material as the first etch stop layer 172. For example, the insulating liner 176 may include a material having an etch selectivity with respect to the material of the second etch stop layer 174. In some example embodiments, the insulating liner 176 may include silicon boron nitride. A thickness t11 of the insulating liner 176 in the first horizontal direction X may be about 10 angstroms to about 100 angstroms but is not limited thereto.

A second interlayer insulation film 190 covering the capacitor structure 180 may be on the second etch stop layer 174. The second interlayer insulation film 190 may cover both the cell array area MCA and the peripheral circuit area PCA.

A peripheral circuit contact PCC, which passes through the second interlayer insulation film 190 and extends in the vertical direction Z, may be arranged in the peripheral circuit area PCA. The peripheral circuit contact PCC may be electrically connected to the peripheral circuit transistor PTR through the contact pad CP_P and the contact plug CP. As shown in FIG. 3, a peripheral circuit contact hole PCCH may pass through the second interlayer insulation film 190 and extend in the vertical direction Z and may be in communication with the bottom plug space 174H of the second etch stop layer 174. The peripheral circuit contact PCC may include a conductive barrier film 192, which is on the inner walls of the peripheral circuit contact hole PCCH and the bottom plug space 174H, and a contact conductive layer 194, which is on the conductive barrier film 192 and fills the peripheral circuit contact hole PCCH and the bottom plug space 174H.

A portion of the peripheral circuit contact PCC in the peripheral circuit contact hole PCCH may be referred to as a main contact portion PCCM, and a portion of the peripheral circuit contact PCC in the bottom plug space 174H may be referred to as a bottom plug PCCB. The bottom plug PCCB may be in contact with the top surface of the contact pad CP_P. For example, the bottom surface of the bottom plug PCCB may be entirely on the top surface of the contact pad CP_P. For example, the bottom plug PCCB may be surrounded by the insulating liner 176 in the bottom plug space 174H, and at least a portion of the bottom surface of the main contact portion PCCM may be on the second etch stop layer 174.

In some example embodiments, the bottom plug PCCB may have a first with W1 in the first horizontal direction X. The main contact portion PCCM may have a second width W2 that is greater than the first with W1 in the first horizontal direction X. In some example embodiments, the bottom plug PCCB may have a second height H2 in the vertical direction Z, and the second height H2 may be about 50 angstroms to about 500 angstroms but is not limited thereto.

In some example embodiments, as shown in FIG. 4, the peripheral circuit contact PCC may include a first peripheral circuit contact PCC1 and a second peripheral circuit contact PCC2. The bottom plug PCCB of the first peripheral circuit contact PCC1 may have a first central line CL1A extending in the vertical direction Z, and the main contact portion PCCM of the first peripheral circuit contact PCC1 may have a second central line CL1B extending in the vertical direction Z. The second central line CL1B may overlap (e.g., may be aligned with) the first central line CL1A. The bottom plug PCCB of the second peripheral circuit contact PCC2 may have a first central line CL2A extending in the vertical direction Z, and the main contact portion PCCM of the second peripheral circuit contact PCC2 may have a second central line CL2B. The second central line CL2B may be apart from (e.g., may not be aligned with) the first central line CL2A in the first horizontal direction X.

The height of the peripheral circuit contact PCC increases as the height of the lower electrode 182 increases, and tilting or misalignment of the peripheral circuit contact hole PCCH may be caused by the warpage of the substrate 110 or the misalignment of a mask pattern in a process of forming the peripheral circuit contact hole PCCH. Accordingly, the peripheral circuit contact hole PCCH may be displaced from the center of the contact pad CP_P, on which the peripheral circuit contact hole PCCH is landed, and a distance between an adjacent contact pad CP_P and the peripheral circuit contact PCC may be relatively decreased, causing a bridge defect.

However, according to some example embodiments, the bottom plug space 174H may be formed first in the second etch stop layer 174, and the second interlayer insulation film 190 may be formed, and then the peripheral circuit contact hole PCCH passing through the second interlayer insulation film 190 may be formed. Therefore, even when the warpage of the substrate 110 or the misalignment of a mask pattern occurs (and thus, the tilting or misalignment of the peripheral circuit contact hole PCCH occurs) in a process of forming the peripheral circuit contact hole PCCH, a relatively large vertical and/or horizontal distance to the adjacent contact pad CP_P may be secured, and accordingly, a bridge defect or the like may be decreased or prevented.

Figure 5:
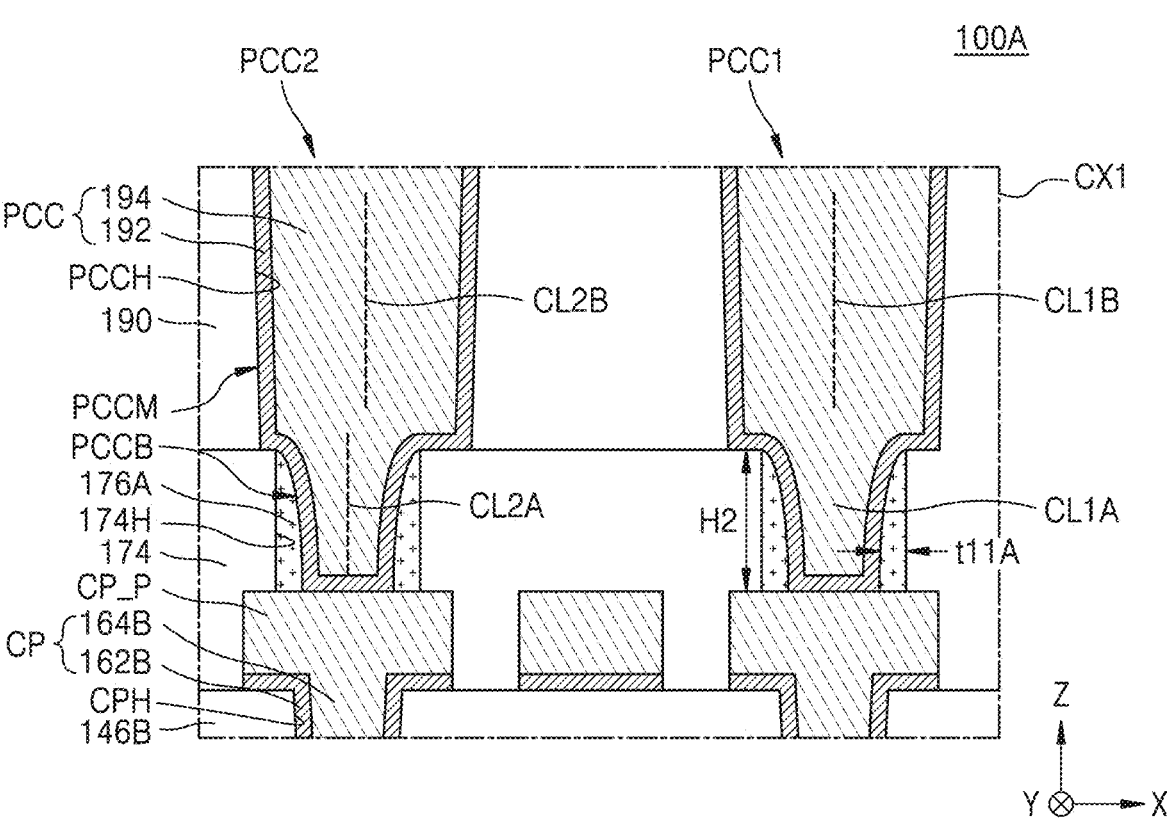
FIG. 5 is a cross-sectional view of a semiconductor device according to an example embodiment.

FIG. 5 is a cross-sectional view of a semiconductor device 100A according to an example embodiment. FIG. 5 is a cross-sectional view of a portion corresponding to the region CX1 in FIG. 3. In FIGS. 1 to 5, like reference characters may denote like elements.

Referring to FIG. 5, an insulating liner 176A may have a first thickness t11A in the first horizontal direction X, and the first thickness t11A may vary with a position in the vertical direction Z. For example, the first thickness t11A of an upper portion of the insulating liner 176A may be less than the first thickness t11A of a lower portion of the insulating liner 176A. The insulating liner 176A may be tapered upwards and have a curved side wall.

Because the insulating liner 176A is tapered upwards, the side wall of the bottom plug PCCB of the peripheral circuit contact PCC may have a curved side wall, wherein the bottom plug PCCB is surrounded by the insulating liner 176A and fills the bottom plug space 174H, and an upper width of the bottom plug PCCB may be greater than a bottom width of the bottom plug PCCB.

FIGS. 6 to 28 are cross-sectional views of stages in a method of manufacturing the semiconductor device 100, according to an example embodiment. In FIGS. 1 to 28, like reference characters may denote like elements.

Figure 6:
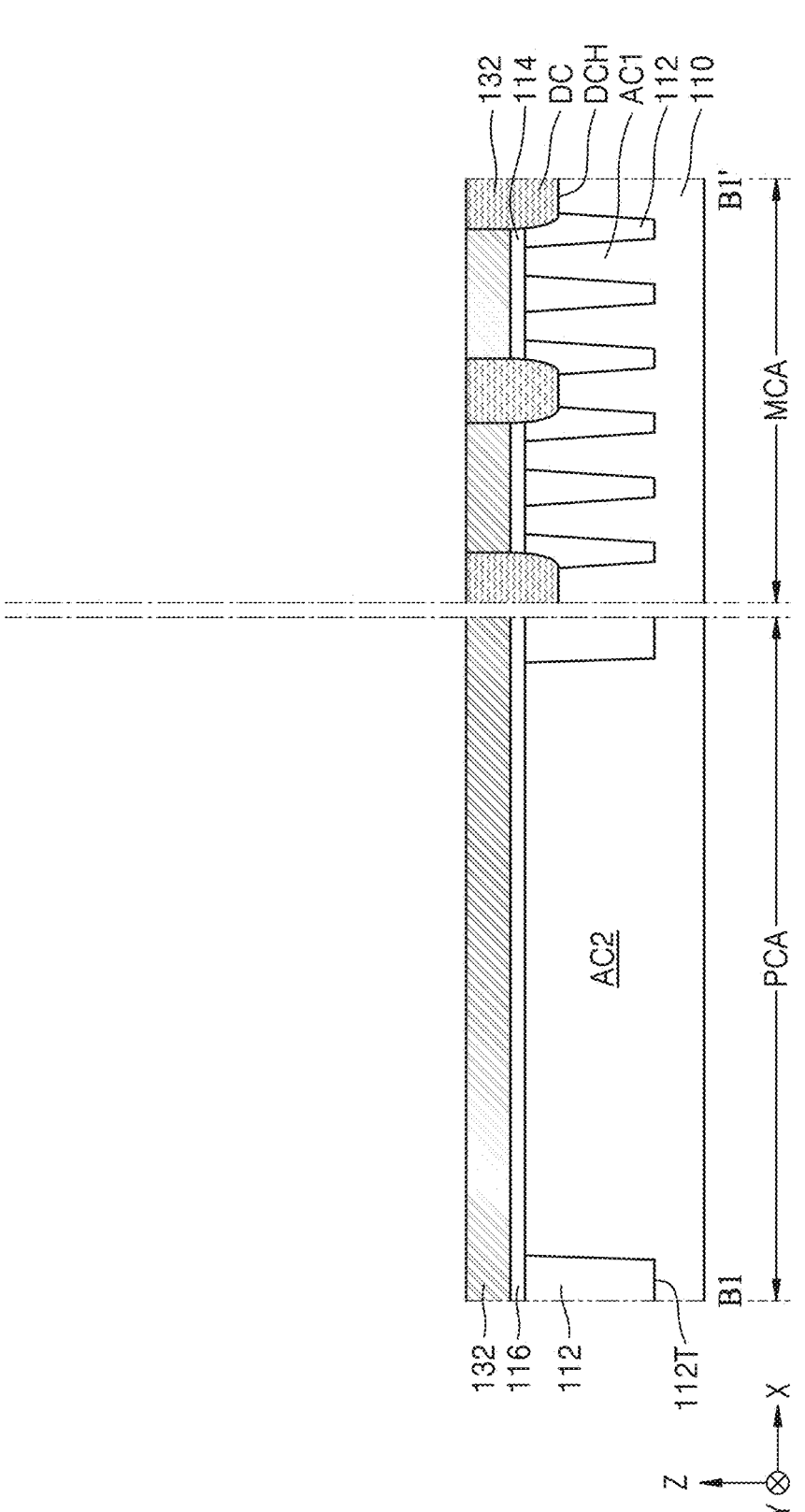

Referring to FIG. 6, a plurality of device isolation trenches 112T and a plurality of device isolation films 112 may be formed in the substrate 110 having the cell array area MCA and the peripheral circuit area PCA such that a plurality of first active regions AC1 are defined in the cell array area MCA and the second active region AC2 is defined in the peripheral circuit area PCA.

Thereafter, the buffer film 114 may be formed on the substrate 110 in the cell array area MCA, and the gate dielectric film 116 may be formed on the substrate 110 in the peripheral circuit area PCA.

Thereafter, a lower conductive layer 132 may be formed on the buffer film 114 and the gate dielectric film 116. In some example embodiments, the lower conductive layer 132 may include Si, Ge, W, WN, Co, Ni, Al, Mo, Ru, Ti, TiN, Ta, TaN, Cu, or a combination thereof. For example, the lower conductive layer 132 may include polysilicon.

A mask pattern (not shown) may be formed on the lower conductive layer 132, and the lower conductive layer 132 and the substrate 110 may be partially removed in the cell array area MCA, thereby forming a direct contact hole DCH exposing a first active region AC1 of the substrate 110. A conductive layer (not shown) may be formed in the direct contact hole DCH, and an upper portion of the conductive layer may be planarized such that the top surface of the lower conductive layer 132 is exposed, thereby forming a direct contact DC in the direct contact hole DCH.

Figure 7:
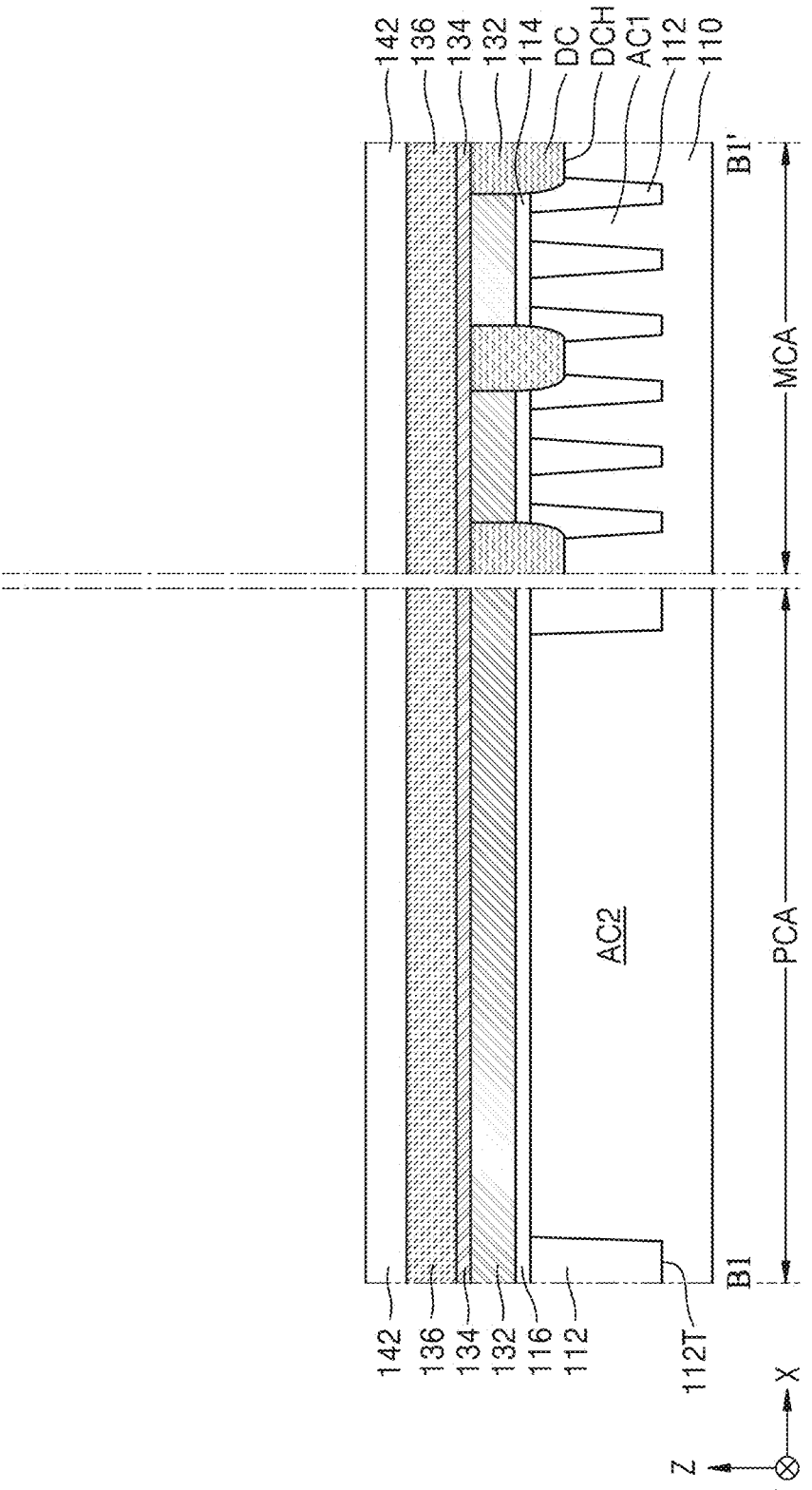

Referring to FIG. 7, a middle conductive layer 134, an upper conductive layer 136, and a lower capping layer 142 may be sequentially formed on the lower conductive layer 132 and the direct contact DC in the cell array area MCA and on the lower conductive layer 132 in the peripheral circuit area PCA. The middle conductive layer 134 and the upper conductive layer 136 may include TIN, TiSiN, W, tungsten silicide, or a combination thereof. The lower capping layer 142 may include a silicon nitride film.

Figure 8:
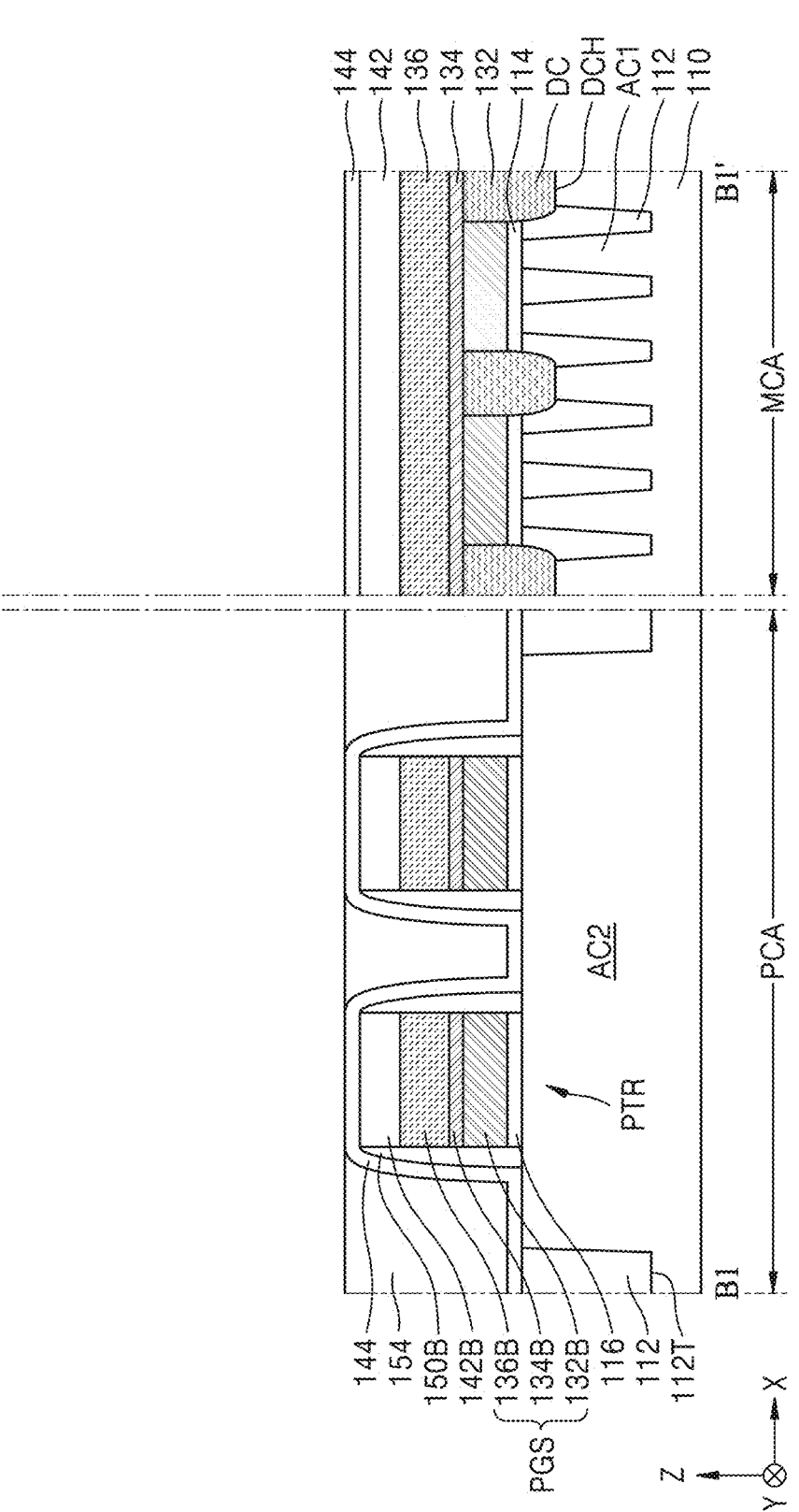

Referring to FIG. 8, in a state in which the cell array area MCA is covered with a mask pattern (not shown), the gate dielectric film 116, the lower conductive layer 132, the middle conductive layer 134, the upper conductive layer 136, and the lower capping layer 142 in the peripheral circuit area PCA may be patterned, thereby forming a peripheral circuit gate electrode PGS, which includes a lower conductive pattern 132B, a middle conductive pattern 134B, and an upper conductive pattern 136B, on the gate dielectric film 116 and a gate capping pattern 142B covering the peripheral circuit gate electrode PGS. Thereafter, an insulating spacer 150B may be formed on both side walls of a stack structure of the gate dielectric film 116, the peripheral circuit gate electrode PGS, and the gate capping pattern 142B.

Thereafter, the lower capping layer 142 in the cell array area MCA may be exposed by removing the mask pattern from the cell array area MCA, and a protective layer 144, which covers the lower capping layer 142 in the cell array area MCA and the peripheral circuit gate electrode PGS and the insulating spacer 150B in the peripheral circuit area PCA, may be formed. Thereafter, a first interlayer insulation film 154, which fills a space around the peripheral circuit gate electrode PGS in the peripheral circuit area PCA, may be formed.

Figure 9:
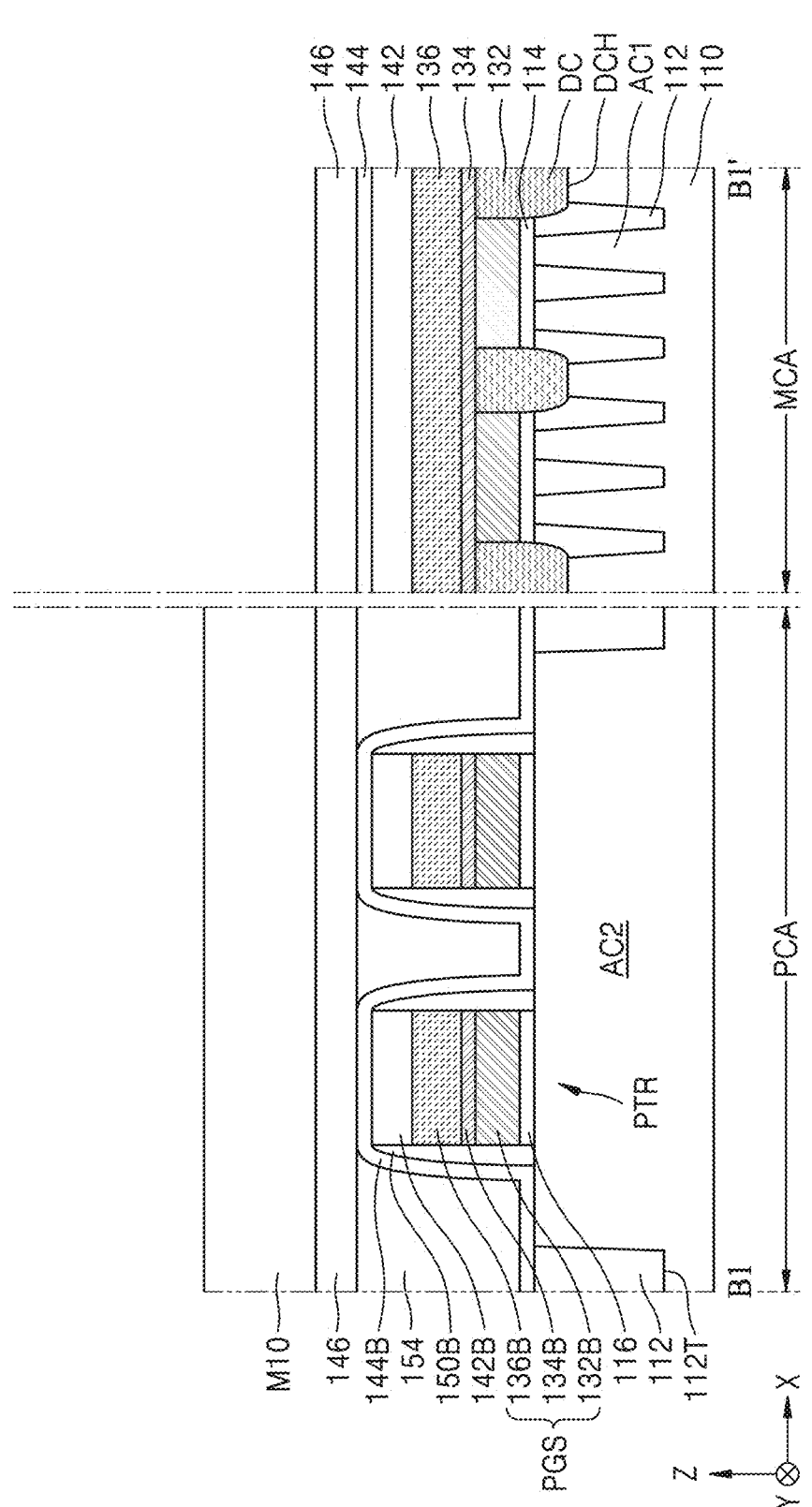

Referring to FIG. 9, an upper capping layer 146 may be formed on the protective layer 144 in the peripheral circuit area PCA and the cell array area MCA. A mask pattern M10 may be formed on the peripheral circuit area PCA to cover a portion of the upper capping layer 146 in the peripheral circuit area PCA.

Figure 10:
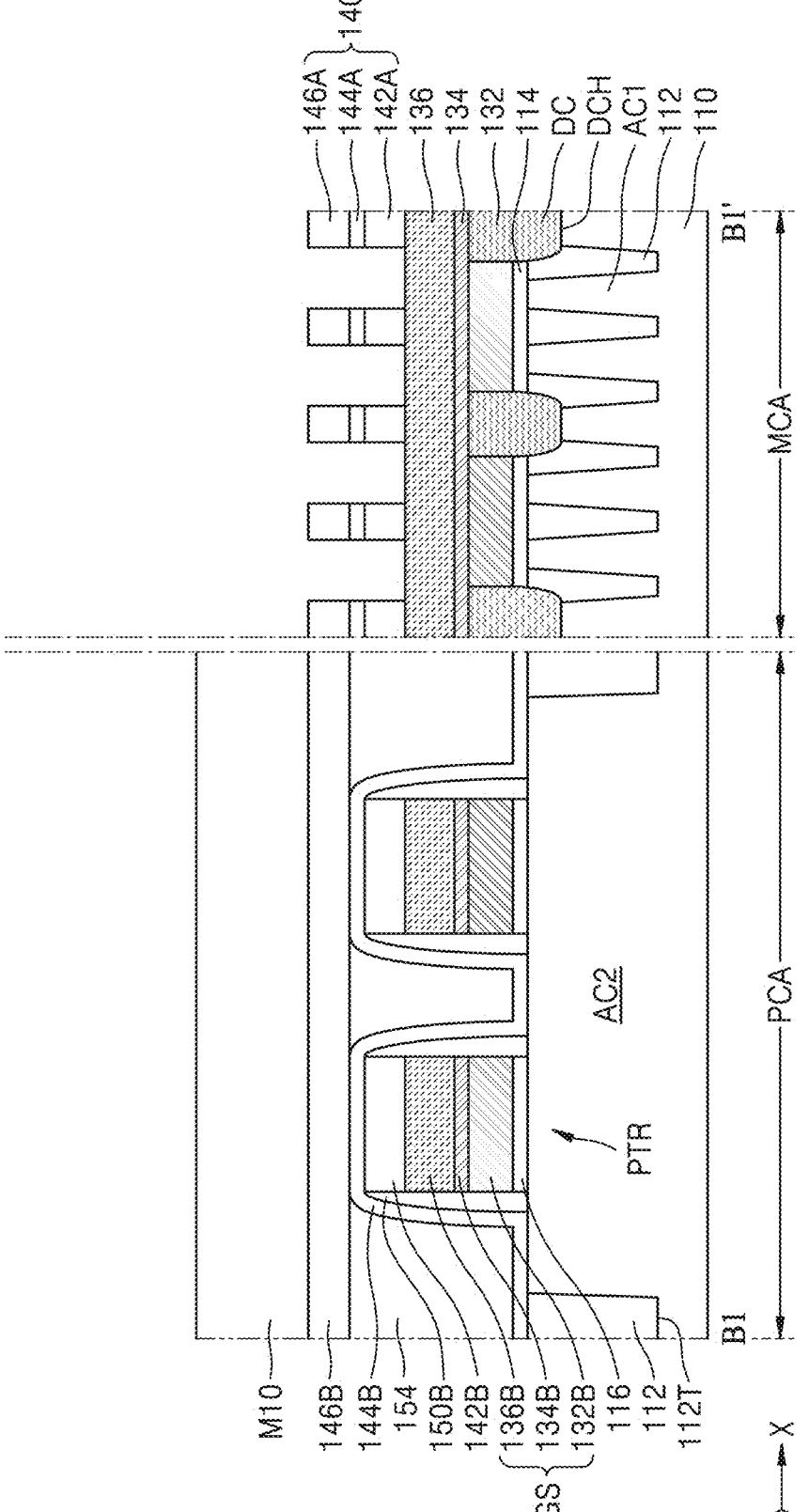

Referring to FIG. 10, the upper capping layer 146, the protective layer 144, and the lower capping layer 142 may be patterned in the cell array area MCA, thereby forming a lower capping pattern 142A, a protective layer pattern 144A, and an upper capping pattern 146A, which are sequentially stacked on the upper conductive layer 136. Here, the lower capping pattern 142A, the protective layer pattern 144A, and the upper capping pattern 146A may be referred to as an insulating capping structure 140.

Figure 11:
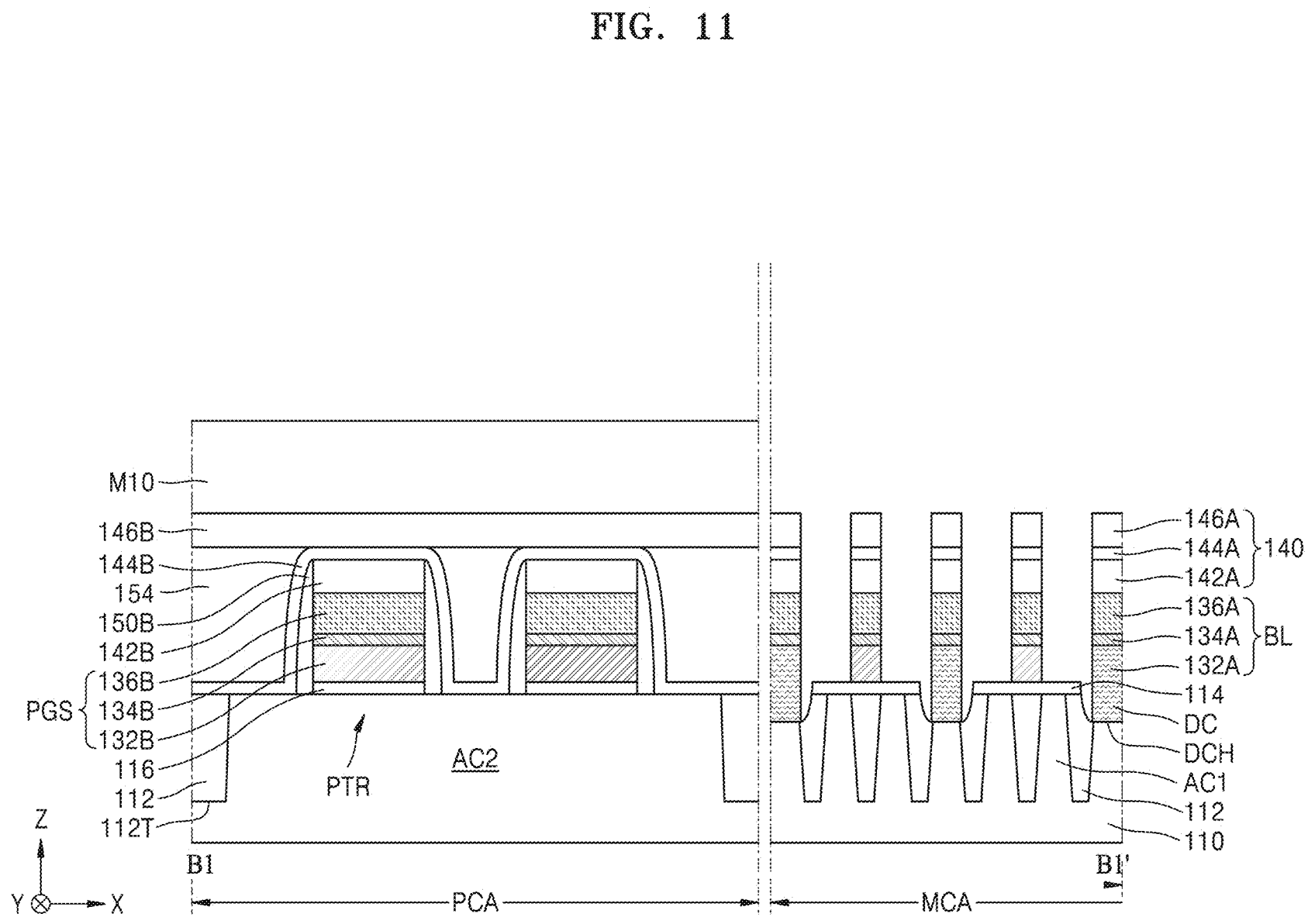

Referring to FIG. 11, a plurality of bit lines BL including a lower conductive pattern 132A, a middle conductive pattern 134A, and an upper conductive pattern 136A may be formed by etching the upper conductive layer 136, the middle conductive layer 134, and the lower conductive layer 132 in the cell array area MCA using the lower capping pattern 142A, the protective layer pattern 144A, and the upper capping pattern 146A as an etch mask.

When the bit lines BL are formed, the side wall of the direct contact DC may be partially removed, and the direct contact hole DCH may be partially exposed.

Figure 12:
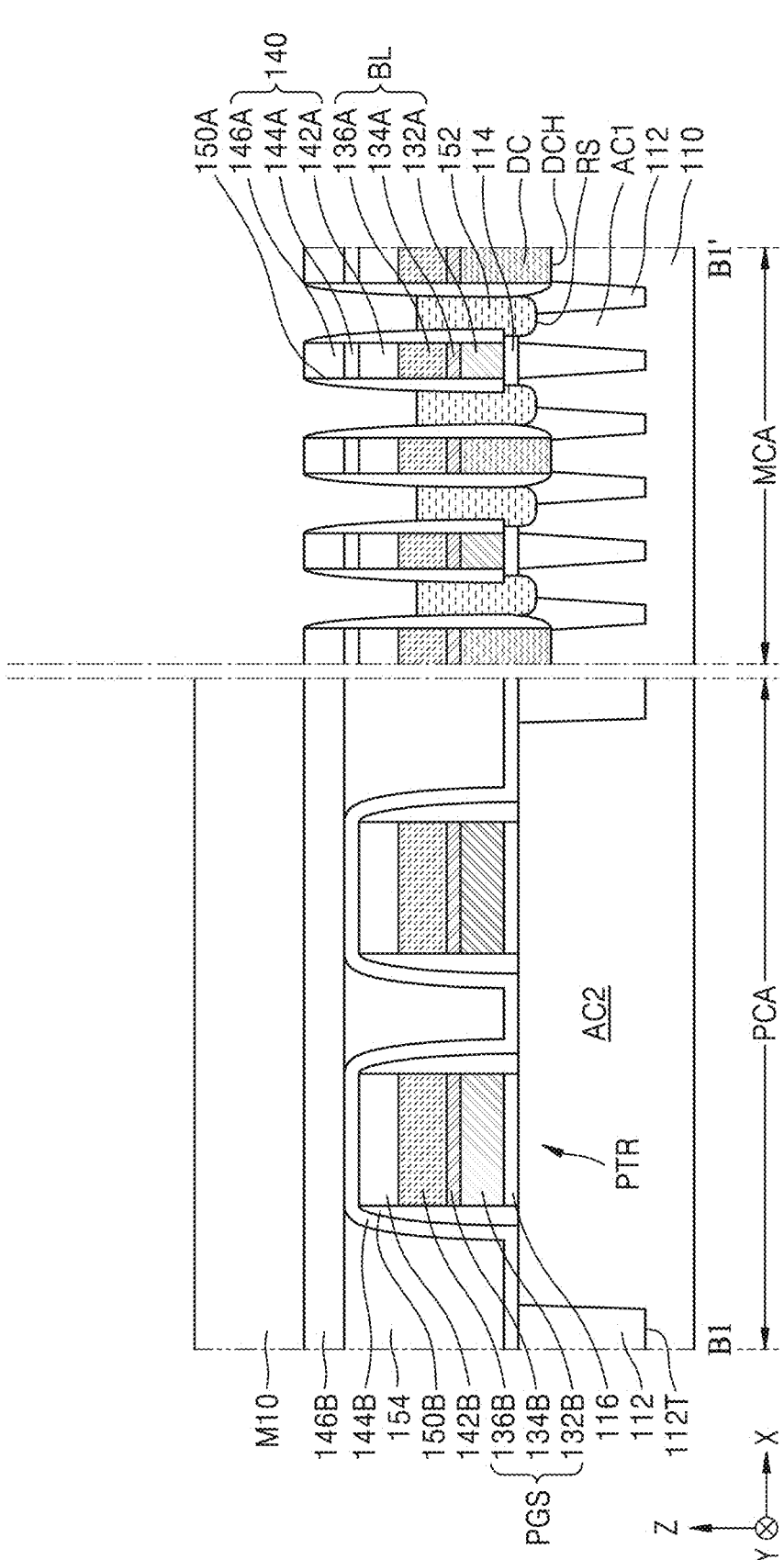

Referring to FIG. 12, a spacer 150A may be formed on a side wall of a bit line BL and a side wall of the insulating capping structure 140 in the cell array area MCA, and a plurality of insulating fences (not shown) may be formed among the bit lines BL.

A plurality of recesses RS, which expose the first active regions AC1 of the substrate 110 among the bit lines BL, may be formed by partially removing the substrate 110 in the bottom of a contact space (not shown) among the bit lines BL and among the insulating fences. Thereafter, a plurality of conductive plugs 152 may be formed to fill the recesses RS and partially fill the contact space between the bit lines BL.

Figure 13:
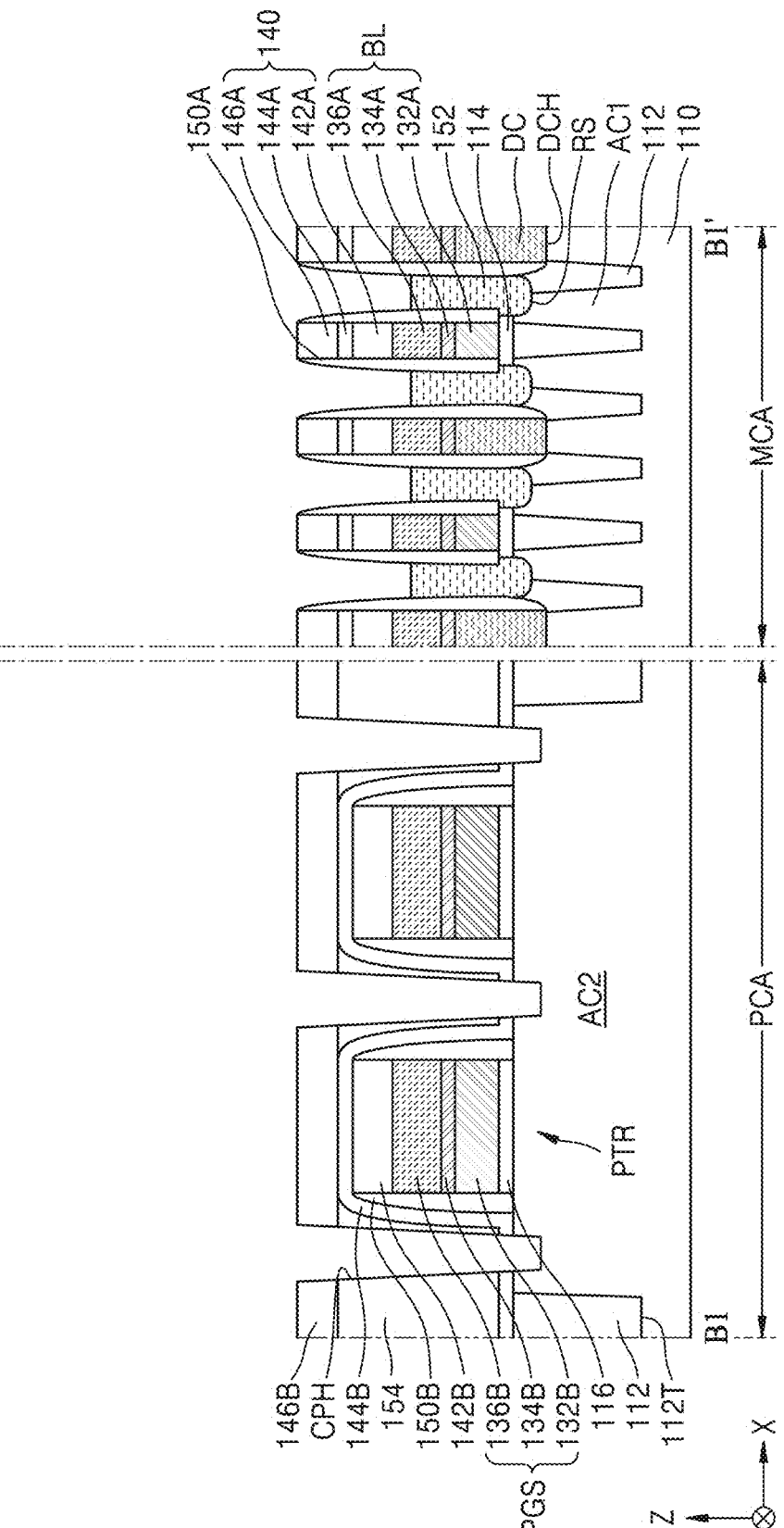

Referring to FIG. 13, the mask pattern M10 (see FIG. 12) may be removed from the peripheral circuit area PCA, and a plurality of contact holes CPH exposing the second active region AC2 of the substrate 110 may be formed by etching the first interlayer insulation film 154.

Figure 14:
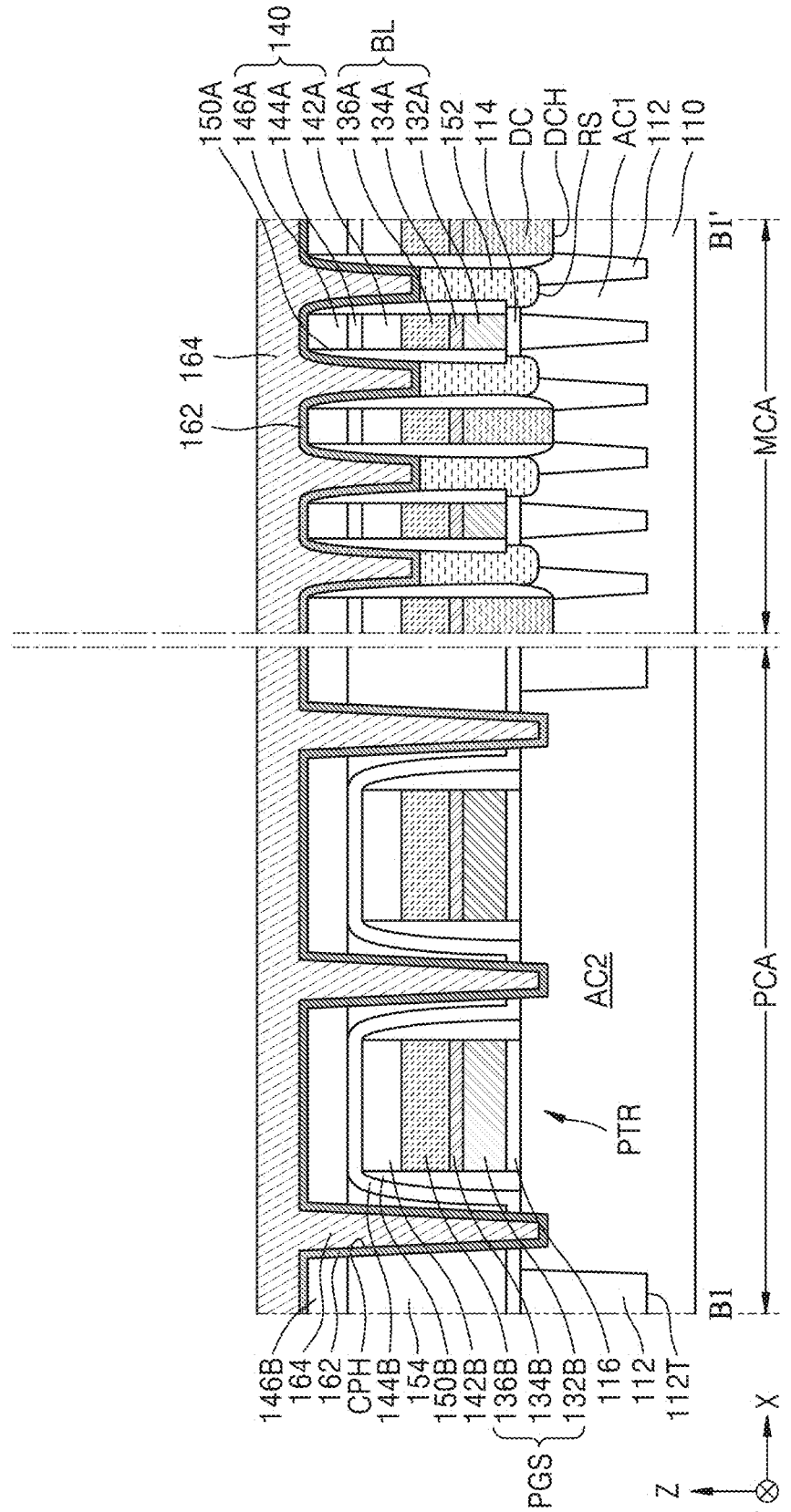

Referring to FIG. 14, a conductive barrier film 162 and a conductive layer 164 may be formed in the cell array area MCA and the peripheral circuit area PCA to cover an exposed surface of the substrate 110.

Before the conductive barrier film 162 is formed, a metal silicide film (not shown) may be formed on the conductive plugs 152 exposed through the contact space in the cell array area MCA, and a metal silicide film (not shown) may be formed on a surface of the second active region AC2 exposed through the contact holes CPH in the peripheral circuit area PCA.

Figure 15:
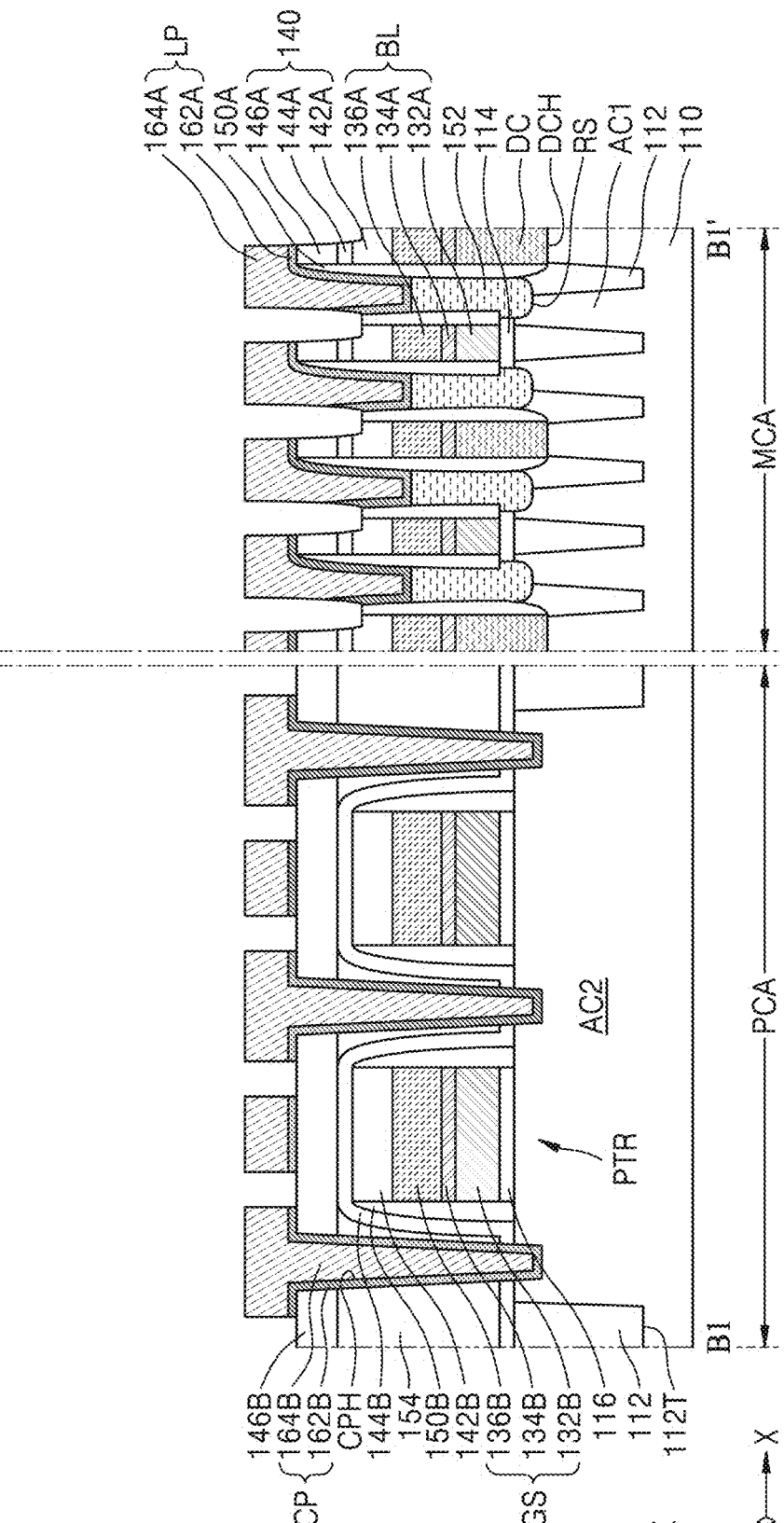

Referring to FIG. 15, a plurality of landing pads LP including a conductive barrier film 162A and a landing pad conductive layer 164A may be formed in the cell array area MCA, and a plurality of contact plugs CP including a conductive barrier film 162B and a landing pad conductive layer 164B may be formed in the peripheral circuit area PCA, by patterning the conductive barrier film 162 and the conductive layer 164.

The landing pads LP may be formed in islands pattern in a plan view. A portion of the conductive barrier film 162B and a portion of the landing pad conductive layer 164B of each of the contact plugs CP may horizontally extend on the capping insulating layer 146B and may be referred to as a contact pad CP_P.

Figure 16:
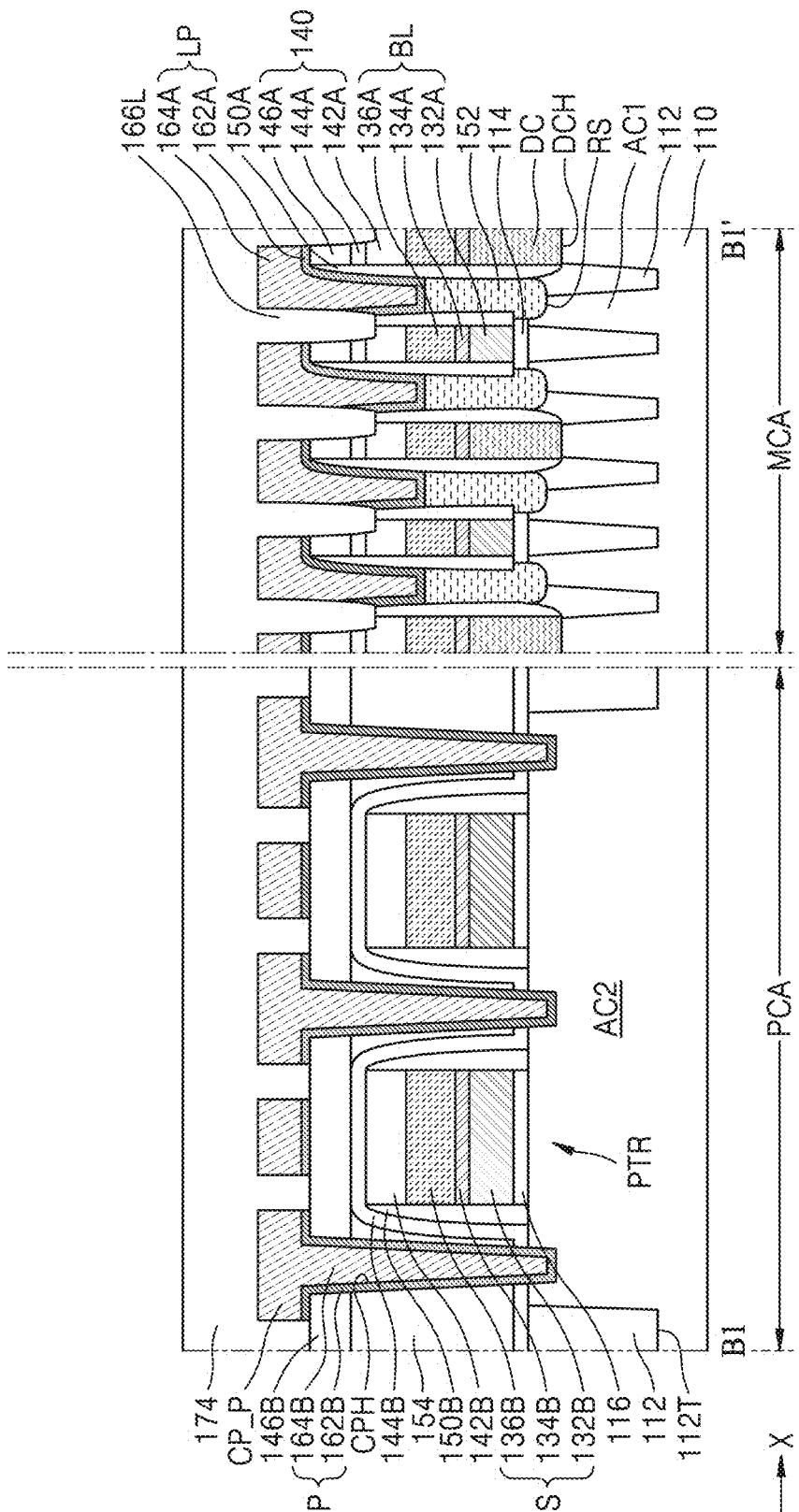

Referring to FIG. 16, an insulating layer 166L covering the landing pads LP may be formed in the cell array area MCA, and a second etch stop layer 174 covering the contact plugs CP and a plurality of contact pads CP_P may be formed in the peripheral circuit area PCA.

In some example embodiments, the insulating layer 166L may include the same material as the second etch stop layer 174, but example embodiments are not limited thereto. In some example embodiments, each of the insulating layer 166L and the second etch stop layer 174 may have a stack structure of multiple material layers. For example, each of the insulating layer 166L and the second etch stop layer 174 may have a stack structure of a first insulating layer (not shown) and a second insulating layer (not shown). The first insulating layer may fill a space among the landing pads LP and a space among the contact pads CP_P, and the second insulating layer may be on the first insulating layer. For example, the first insulating layer may include a material having a high step coverage but is not limited thereto.

Figure 17:
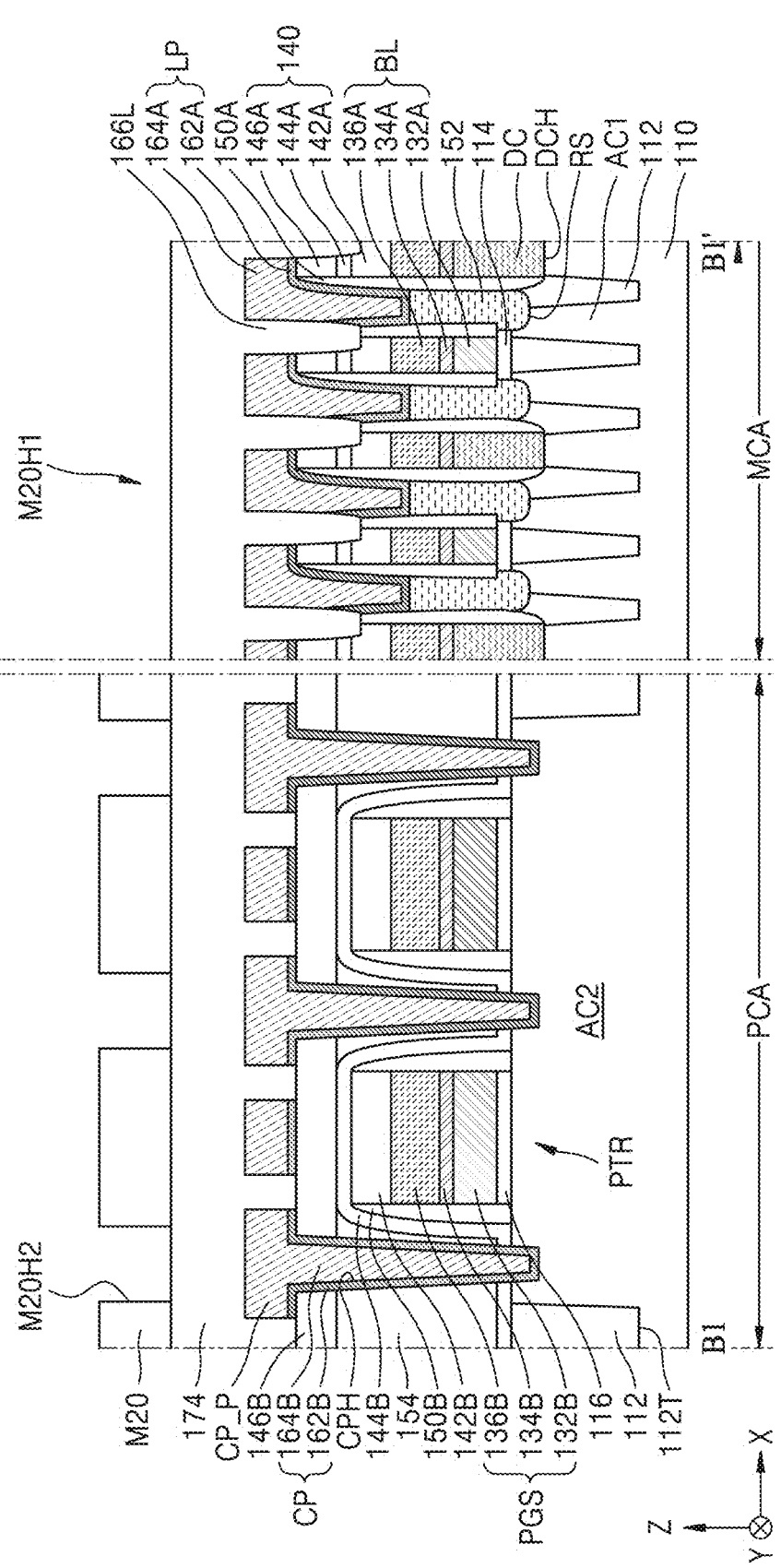

Referring to FIG. 17, a second mask pattern M20 may be formed on the insulating layer 166L and the second etch stop layer 174. The second mask pattern M20 may include a first opening M20H1 in the cell array area MCA and a plurality of second openings M20H2 in the peripheral circuit area PCA. The first opening M20H1 may entirely expose the top surface of the insulating layer 166L in the cell array area MCA, and the second openings M20H2 may partially expose the second etch stop layer 174 in the peripheral circuit area PCA.

Figure 18:
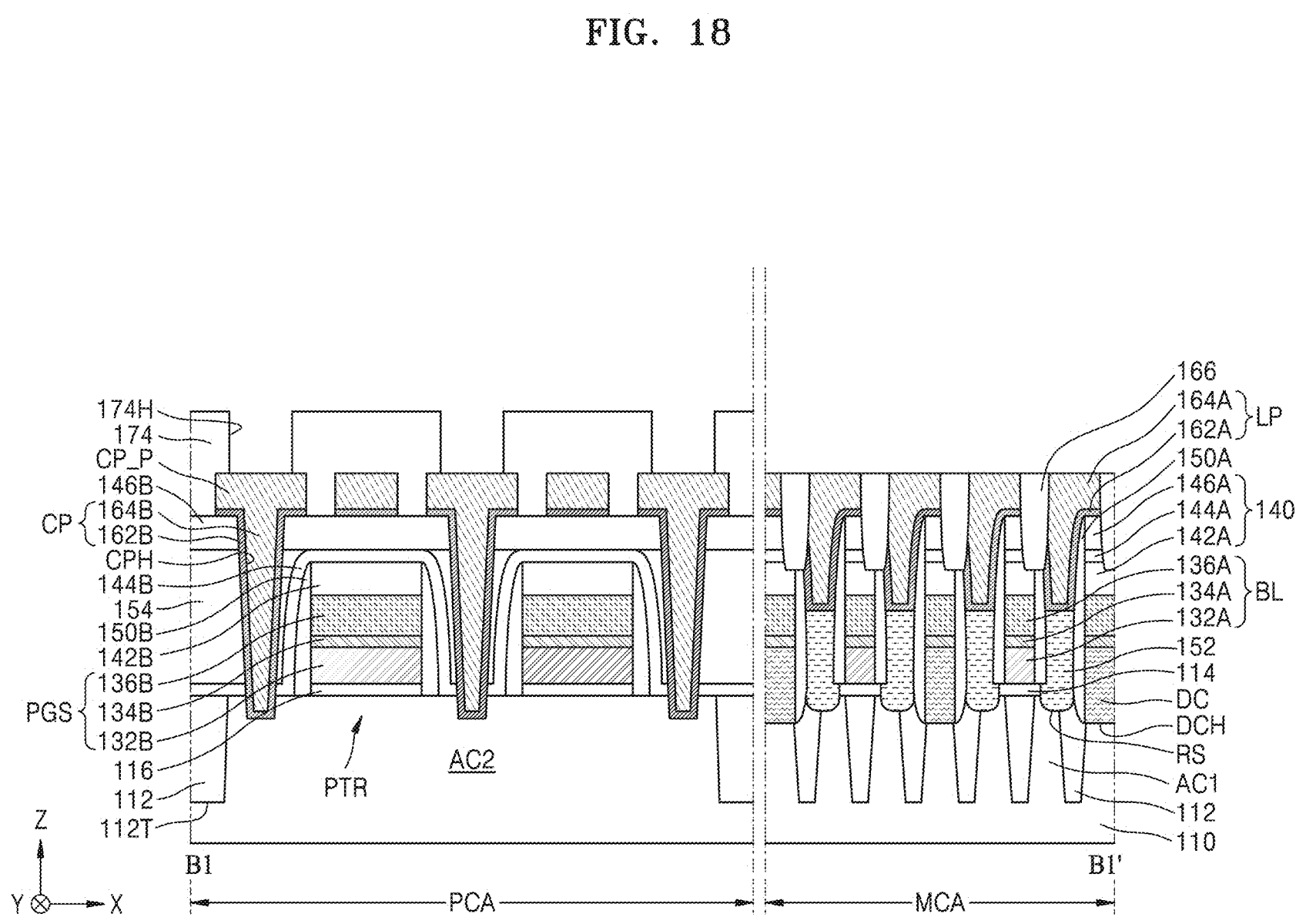

Referring to FIG. 18, an insulating pattern 166 surrounding each of the landing pads LP may be formed in the cell array area MCA, and a bottom plug space 174H passing through the second etch stop layer 174 may be formed in the peripheral circuit area PCA, by etching back the insulating layer 166L exposed by the first opening M20H1 of the second mask pattern M20 and the second etch stop layer 174 exposed by the second openings M20H2 of the second mask pattern M20.

As a result of the etching back process, the top surface of each of the landing pads LP may be exposed in the cell array area MCA, and the top surface of each of the contact pads CP_P in the bottom of the bottom plug space 174H may be exposed in the peripheral circuit area PCA.

Thereafter, the second mask pattern M20 may be removed.

Figure 19:
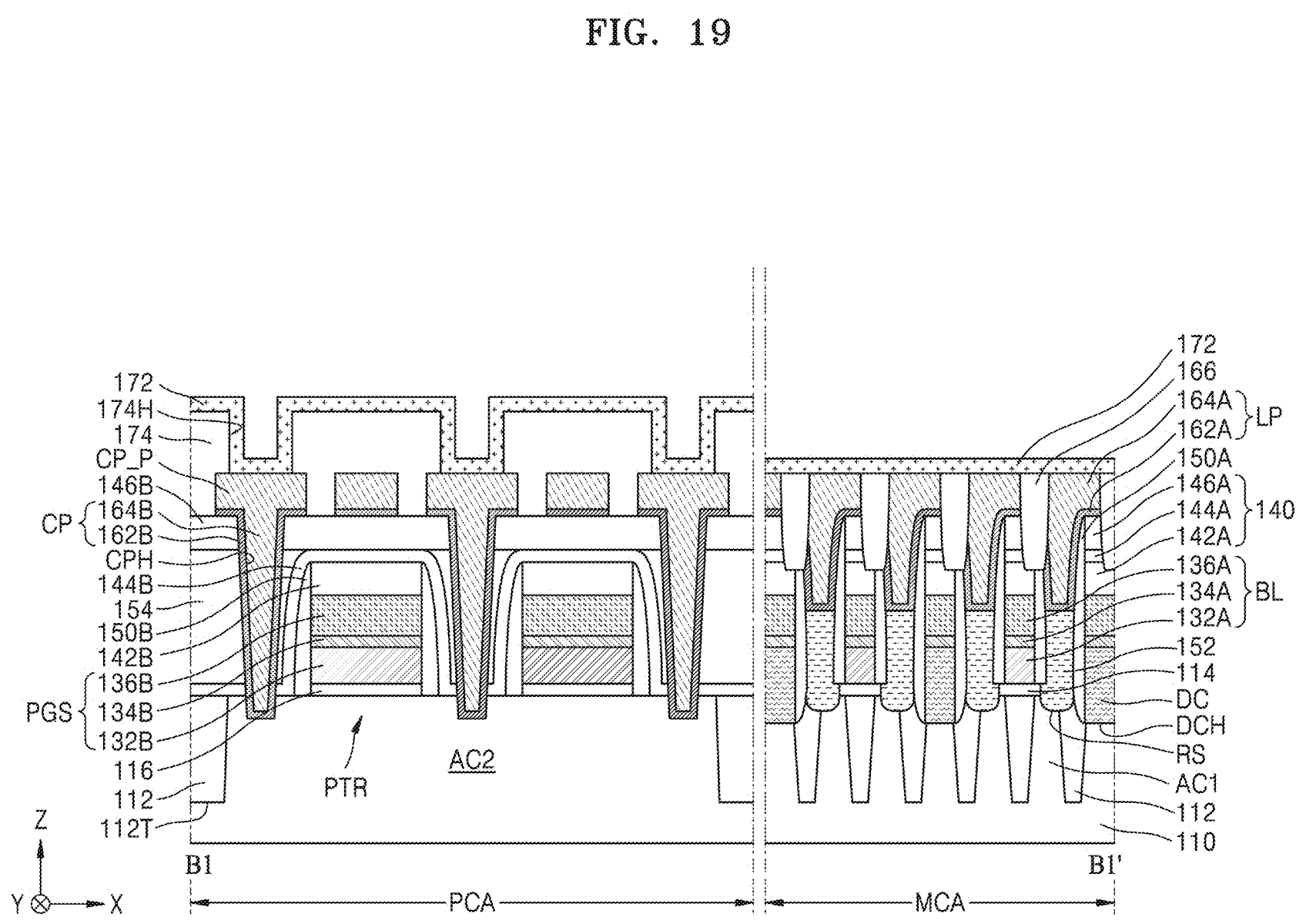

Referring to FIG. 19, a first etch stop layer 172 may be formed in the cell array area MCA and the peripheral circuit area PCA. The first etch stop layer 172 may be on the landing pads LP and the insulating pattern 166 in the cell array area MCA and may be on the top surface of the second etch stop layer 174, the side walls of the bottom plug space 174H, and the top surfaces of the contact pads CP_P exposed in the bottom portion of the bottom plug space 174H in the peripheral circuit area PCA.

In some example embodiments, the first etch stop layer 172 may include a material having an etch selectivity with respect to the insulating pattern 166 and the second etch stop layer 174. For example, the first etch stop layer 172 may include SiBN. The first etch stop layer 172 may have the first height H1 of about 10 angstroms to about 100 angstroms in the vertical direction Z but is not limited thereto.

Figure 20:
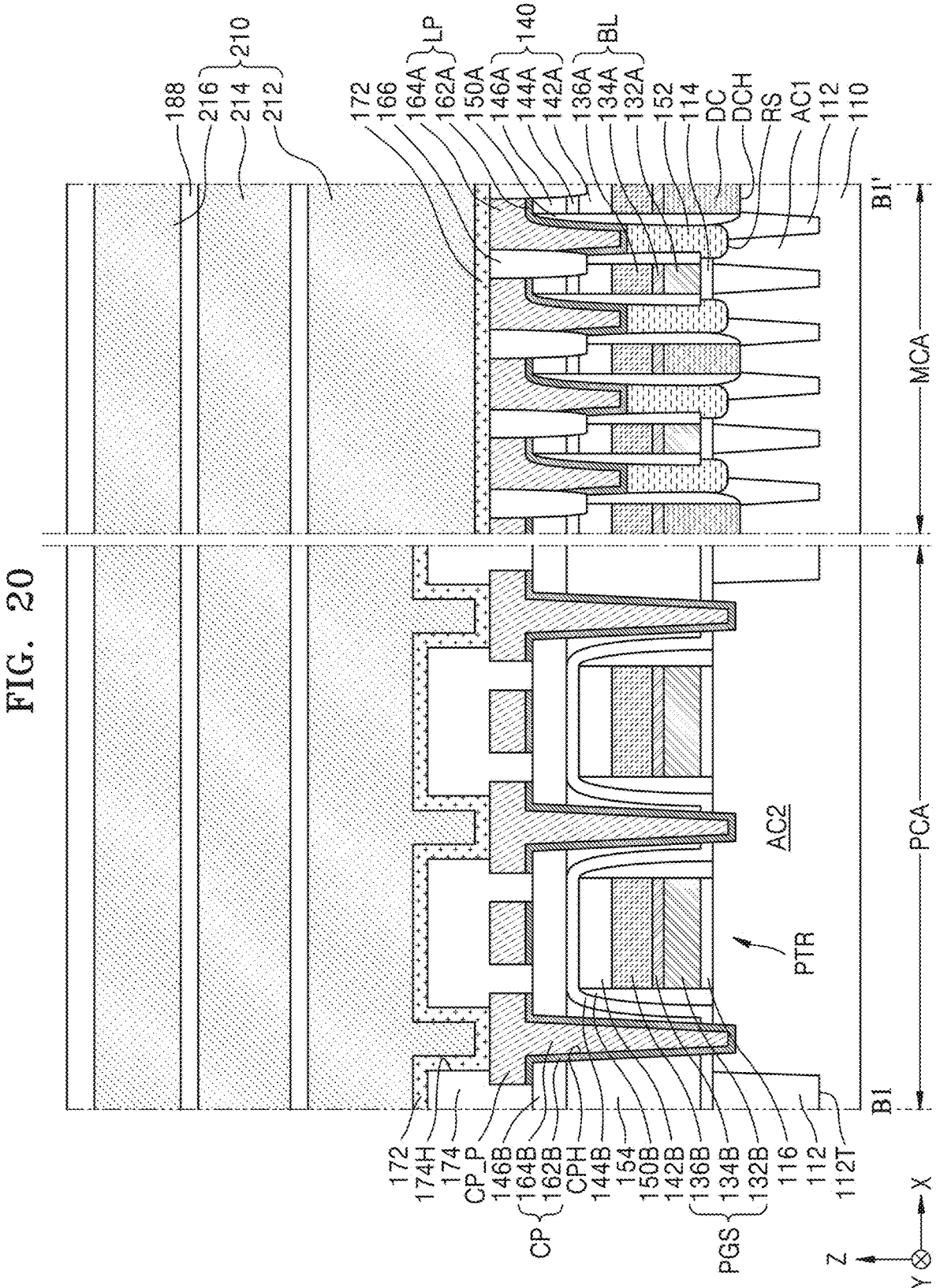

Referring to FIG. 20, a mold structure 210 may be formed on the first etch stop layer 172 and the second etch stop layer 174. For example, the mold structure 210 may include a first mold layer 212, a second mold layer 214, and a third mold layer 216, which are sequentially stacked on the first etch stop layer 172 and the second etch stop layer 174. A support layer 188 may be selectively formed between the first mold layer 212 and the second mold layer 214, between the second mold layer 214 and the third mold layer 216, and on the third mold layer 216.

Although it is illustrated in FIG. 3 that three support layers 188 are formed, the number of support layers 188 is not limited to three. The number of support layers 188 may vary with the height of the lower electrode 182.

In some example embodiments, a support layer 188 may include a material having an etch selectivity with respect to the material of the mold structure 210. For example, the first to third mold layers 212, 214, and 216 may include silicon oxide, and the support layer 188 may include silicon nitride.

Figure 21:
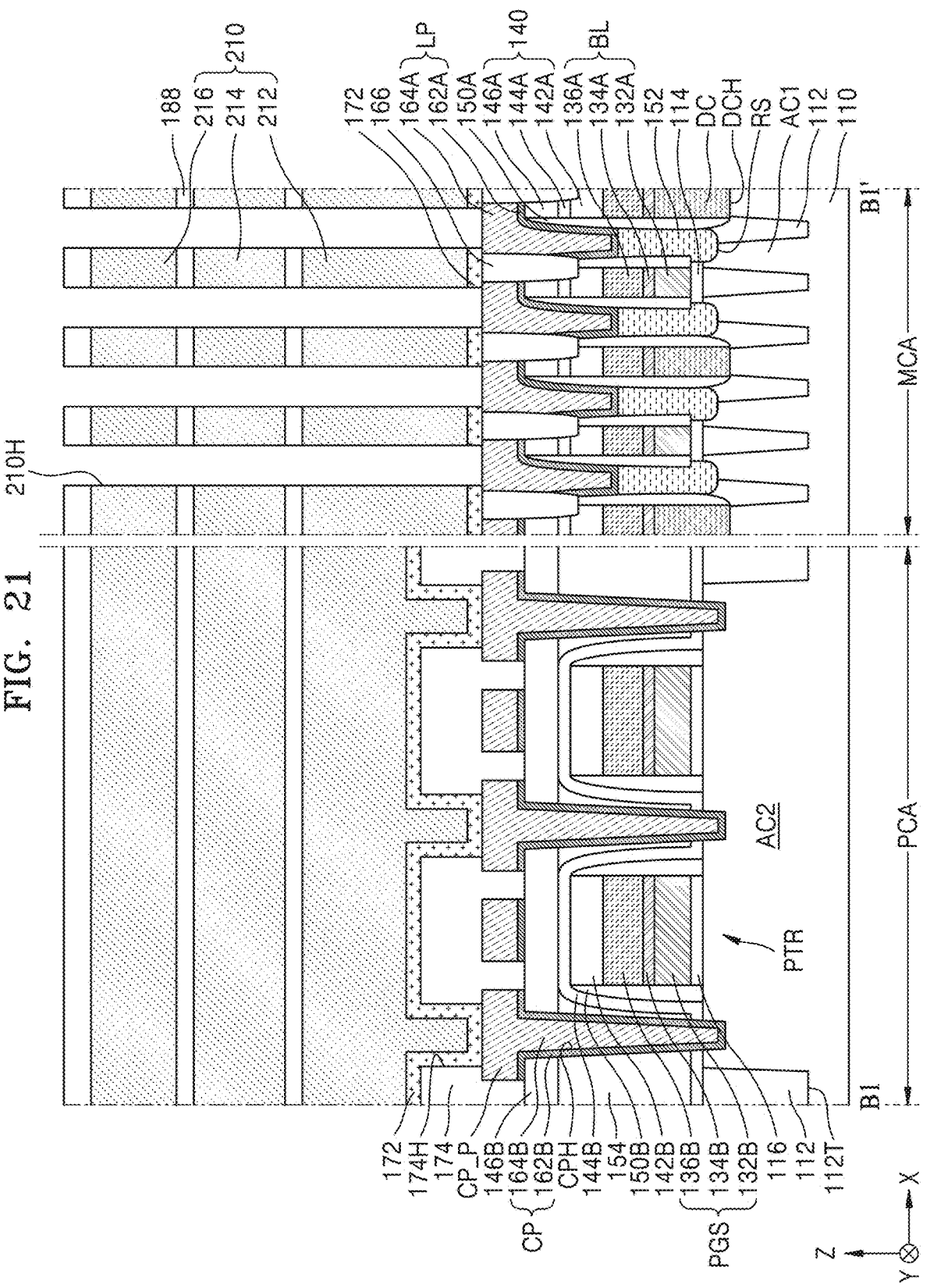

Referring to FIG. 21, a mask pattern (not shown) may be formed on the mold structure 210, and a mold opening 210H passing through the mold structure 210 may be formed in the cell array area MCA using the mask pattern as an etch mask. For example, in a plan view, the mold opening 210H may be arranged in a hexagonal shape but is not limited thereto.

Thereafter, a portion of the first etch stop layer 172 exposed in a bottom portion of the mold opening 210H may be further removed, thereby forming an opening 172H and exposing the top surface of a landing pad LP.

Figure 22:
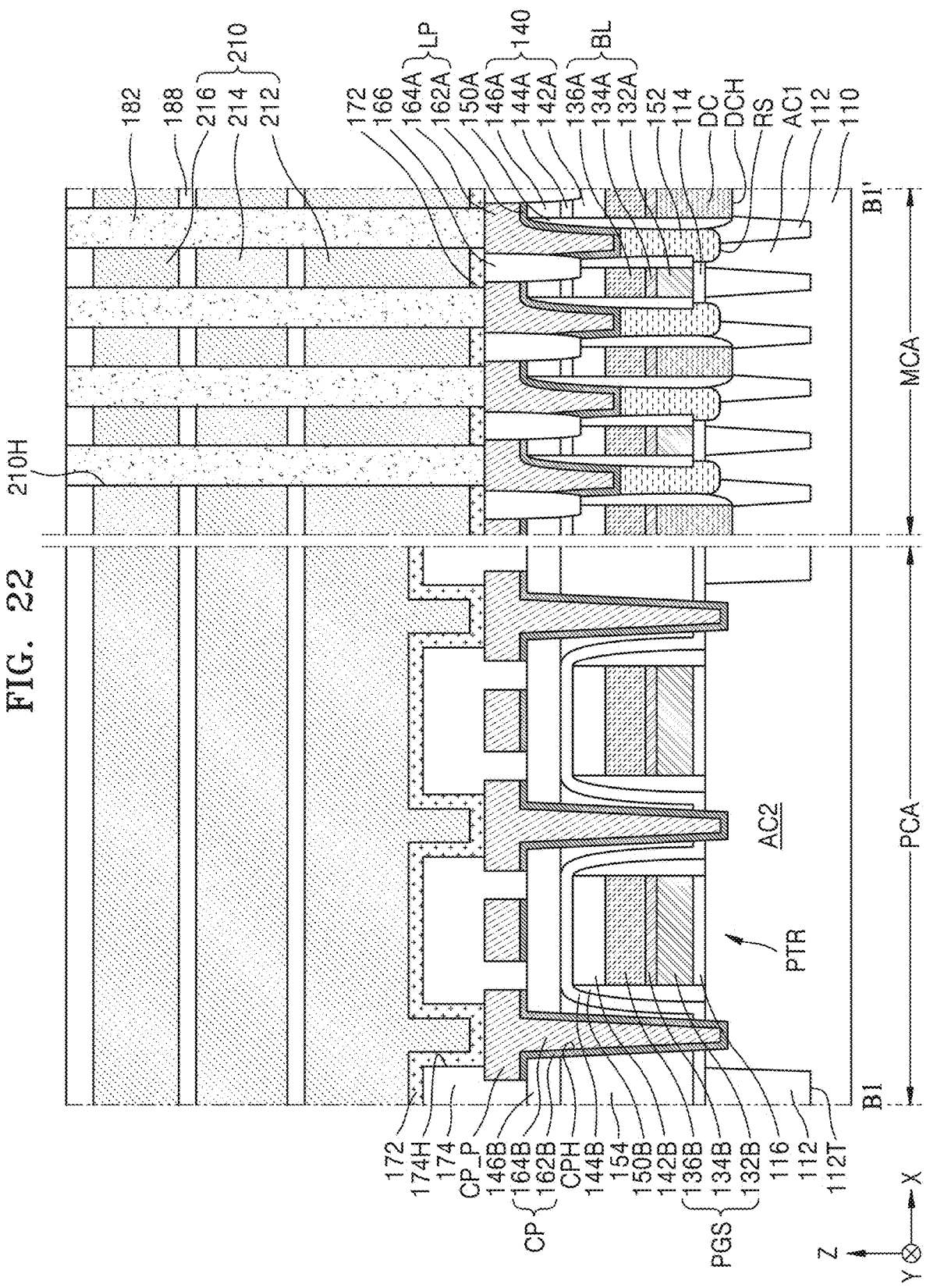

Referring to FIG. 22, the lower electrode 182 may be formed in the mold opening 210H and the opening 172H by forming a conductive layer (not shown) filling the mold opening 210H and the opening 172H, and planarizing an upper portion of the conductive layer to expose the top surface of a topmost support layer 188. The bottom surface of the lower electrode 182 may be in contact with the landing pad LP.

Figure 23:
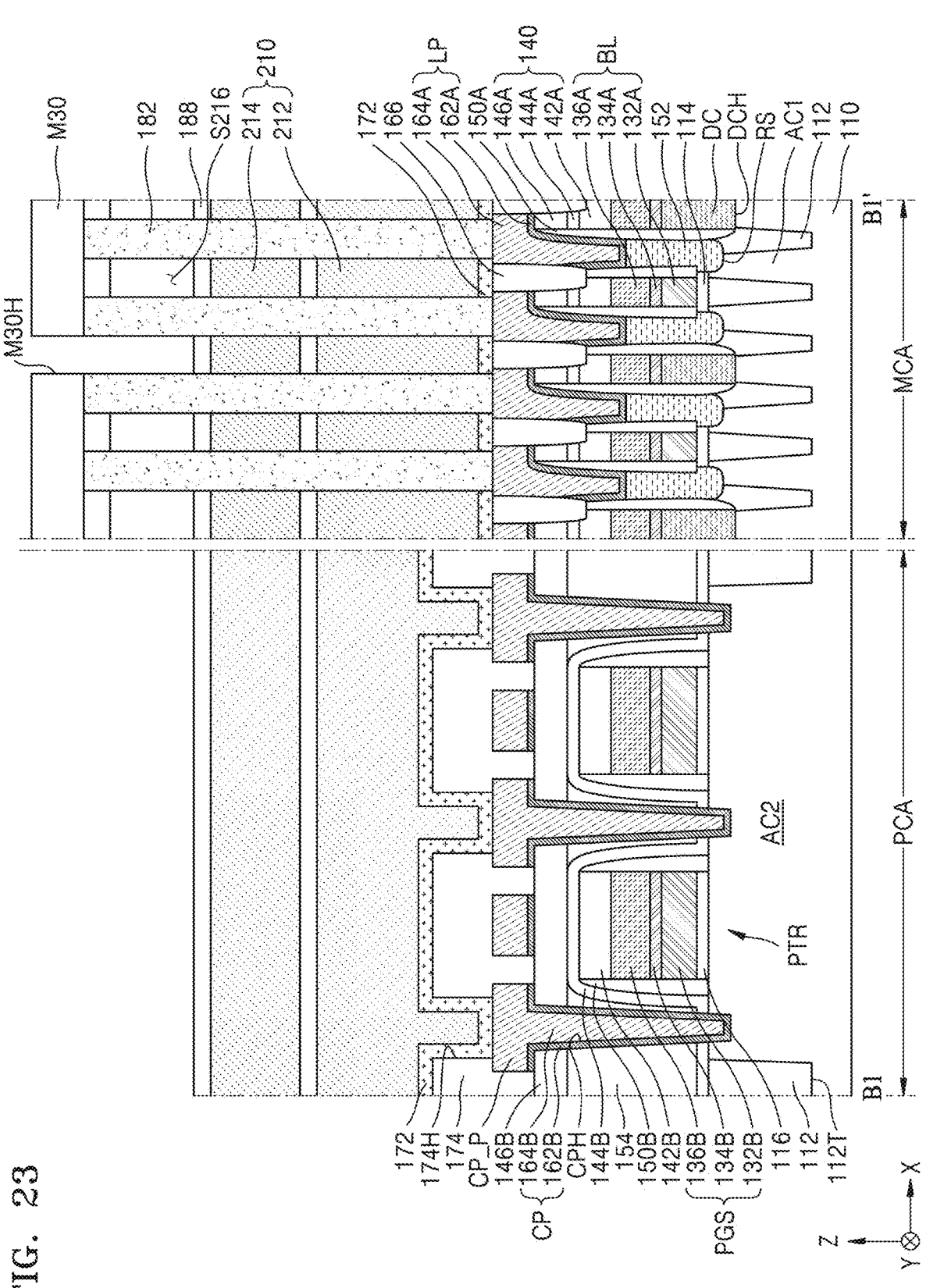

Referring to FIG. 23, a cover mask pattern M30 covering the top surface of the lower electrode 182 may be formed in the cell array area MCA. The cover mask pattern M30 may include an opening M30H exposing the top surface of the topmost support layer 188.

Thereafter, a portion of the topmost support layer 188 exposed by the opening M30H may be removed such that the opening M30H may extend downwards.

Thereafter, the third mold layer 216 (see FIG. 16) may be removed through the opening M30H, thereby forming a third mold space S216. An upper side wall of the lower electrode 182 may be exposed by the third mold space S216.

In some example embodiments, the third mold layer 216 may be removed by an etching process using an etchant including ammonium fluoride ($NH_4F$), hydrogen fluoride (HF), and water, but example embodiments are not limited thereto.

Figure 24:
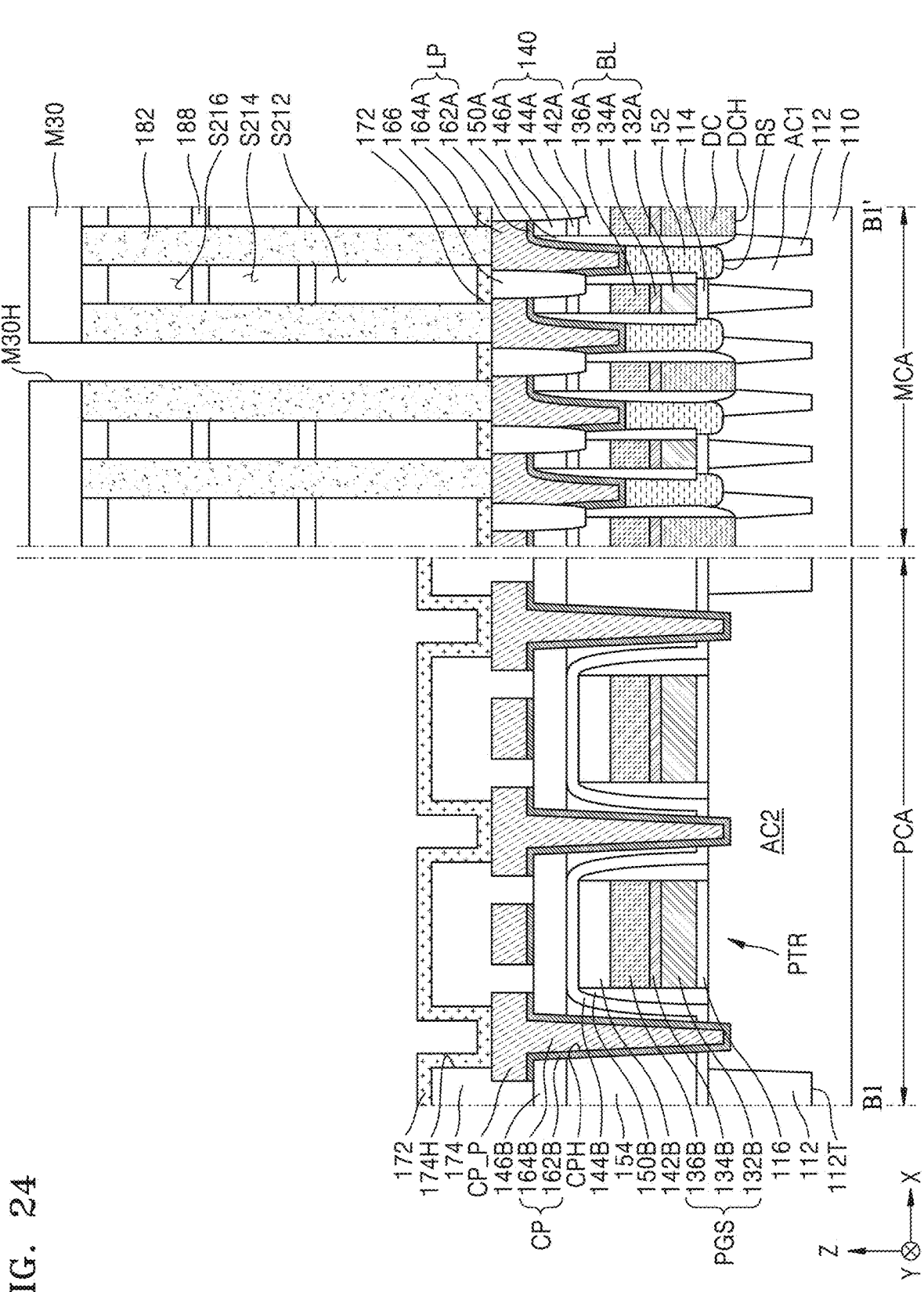

Referring to FIG. 24, a portion of the support layer 188 exposed by the opening M30H (e.g., a portion of the support layer 188 exposed in the third mold space S216) may be removed such that the opening M30H may extend downwards. Thereafter, the second mold layer 214 (see FIG. 23) may be removed through the opening M30H, thereby forming a second mold space S214.

Thereafter, a portion of a lowest support layer 188 exposed by the opening M30H may be removed such that the opening M30H may extend downwards. Thereafter, the first mold layer 212 (see FIG. 23) may be removed through the opening M30H, thereby forming a first mold space S212.

The first mold layer 212, the second mold layer 214, and the third mold layer 216 in the peripheral circuit area PCA may be entirely removed such that the top surface of the first etch stop layer 172 may be exposed.

Figure 25:
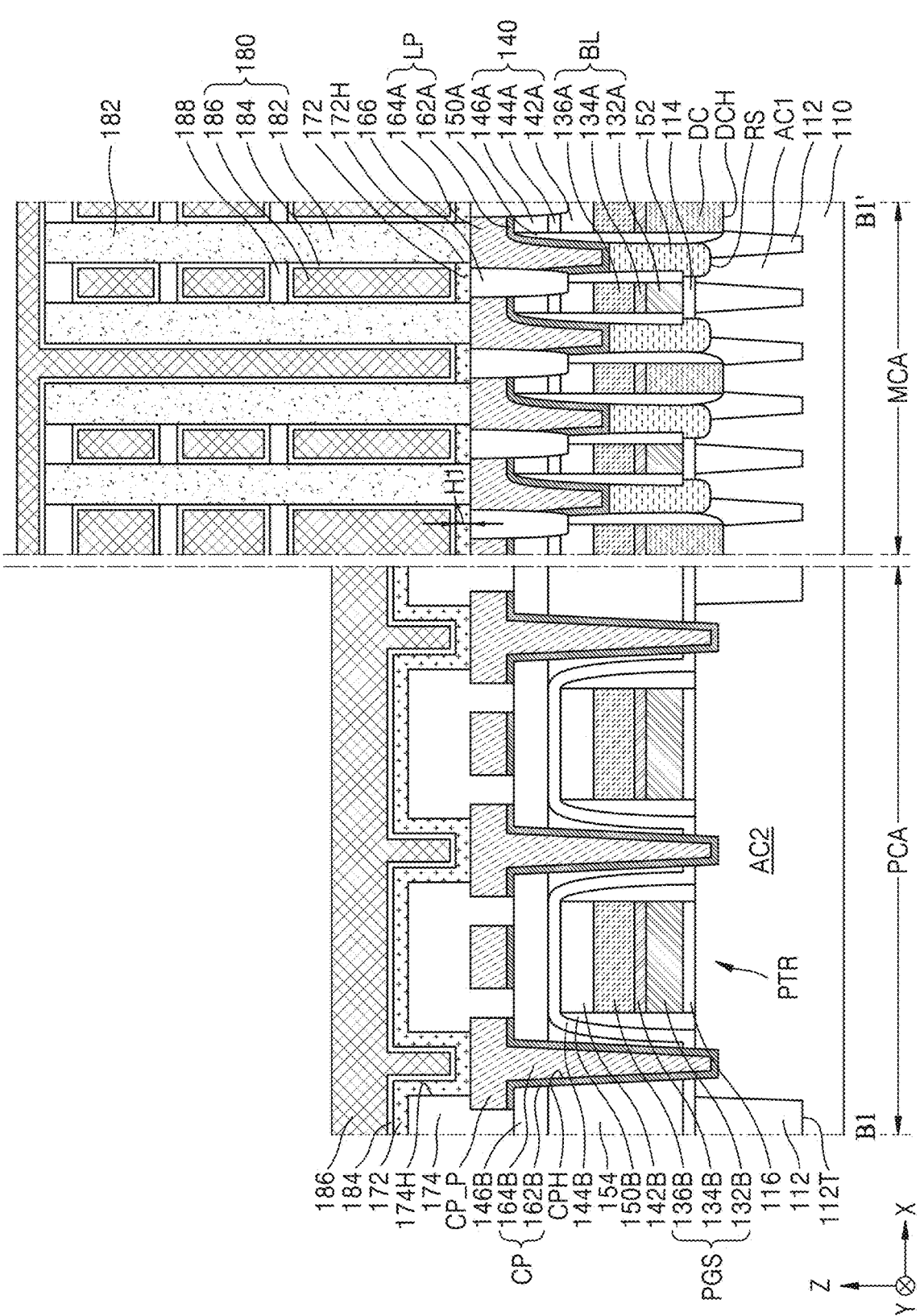

Referring to FIG. 25, a capacitor dielectric layer 184 and an upper electrode 186 may be sequentially formed on the lower electrode 182 and the support layer 188, thereby forming a capacitor structure 180.

Figure 26:
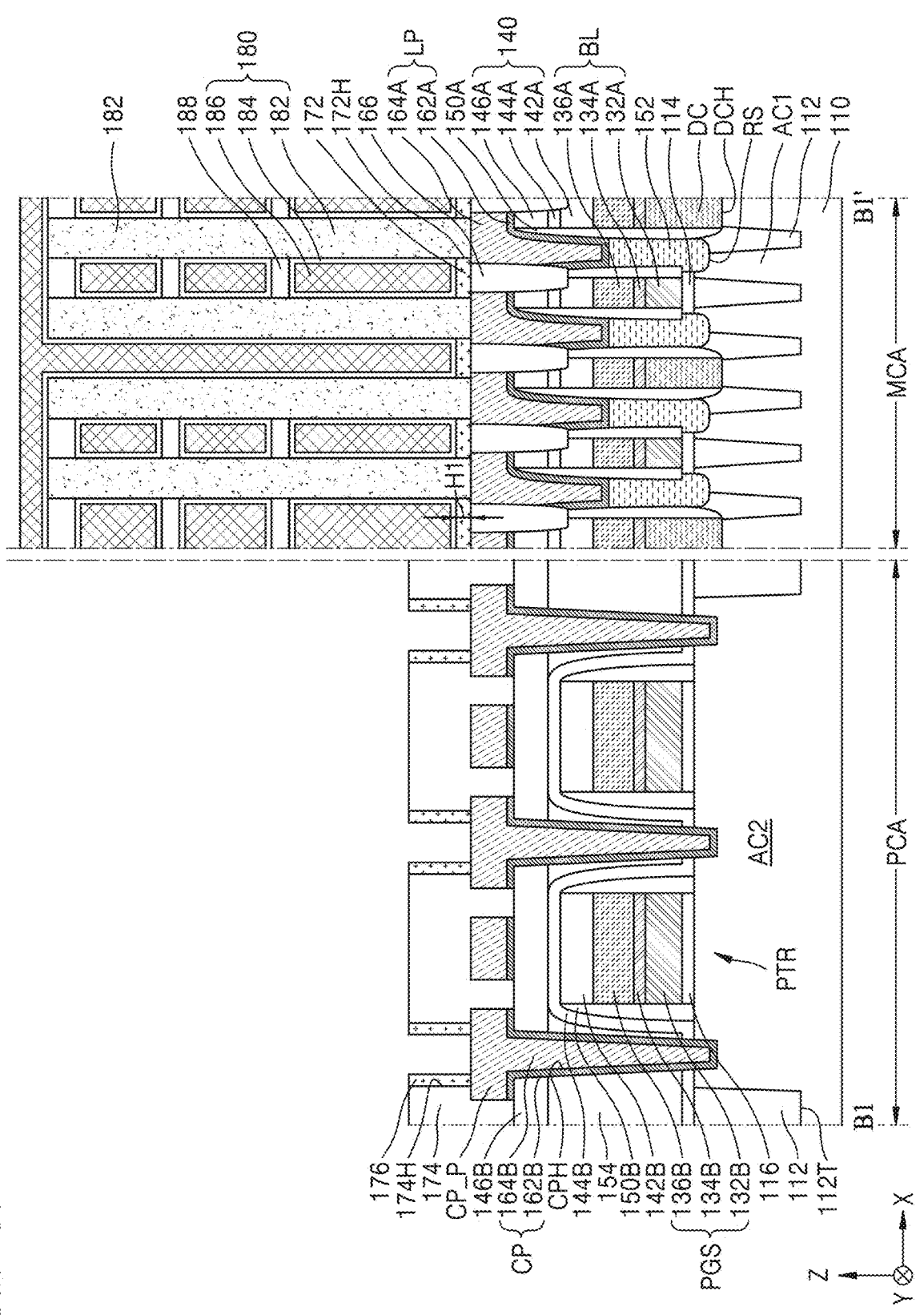

Referring to FIG. 26, a mask pattern (not shown) may be formed on the upper electrode 186 in the cell array area MCA, and portions of the upper electrode 186 and the capacitor dielectric layer 184 in the peripheral circuit area PCA may be removed. Thereafter, an anisotropic etching process may be performed on the first etch stop layer 172 exposed in the peripheral circuit area PCA to leave an insulating liner 176 on the side wall portion of the second etch stop layer 174 defining the bottom plug space 174H.

In some example embodiments, the insulating liner 176 may be formed to have the same or substantially similar thickness t11 (see FIG. 4) in the first horizontal direction X throughout the full height thereof, as shown in FIG. 26.

In some example embodiments, a portion of the insulating liner 176 in the entrance of the bottom plug space 174H of the second etch stop layer 174 may be etched relatively more during the anisotropic etching process. In this case, the insulating liner 176 may be tapered upwards, as shown in FIG. 5.

Figure 27:
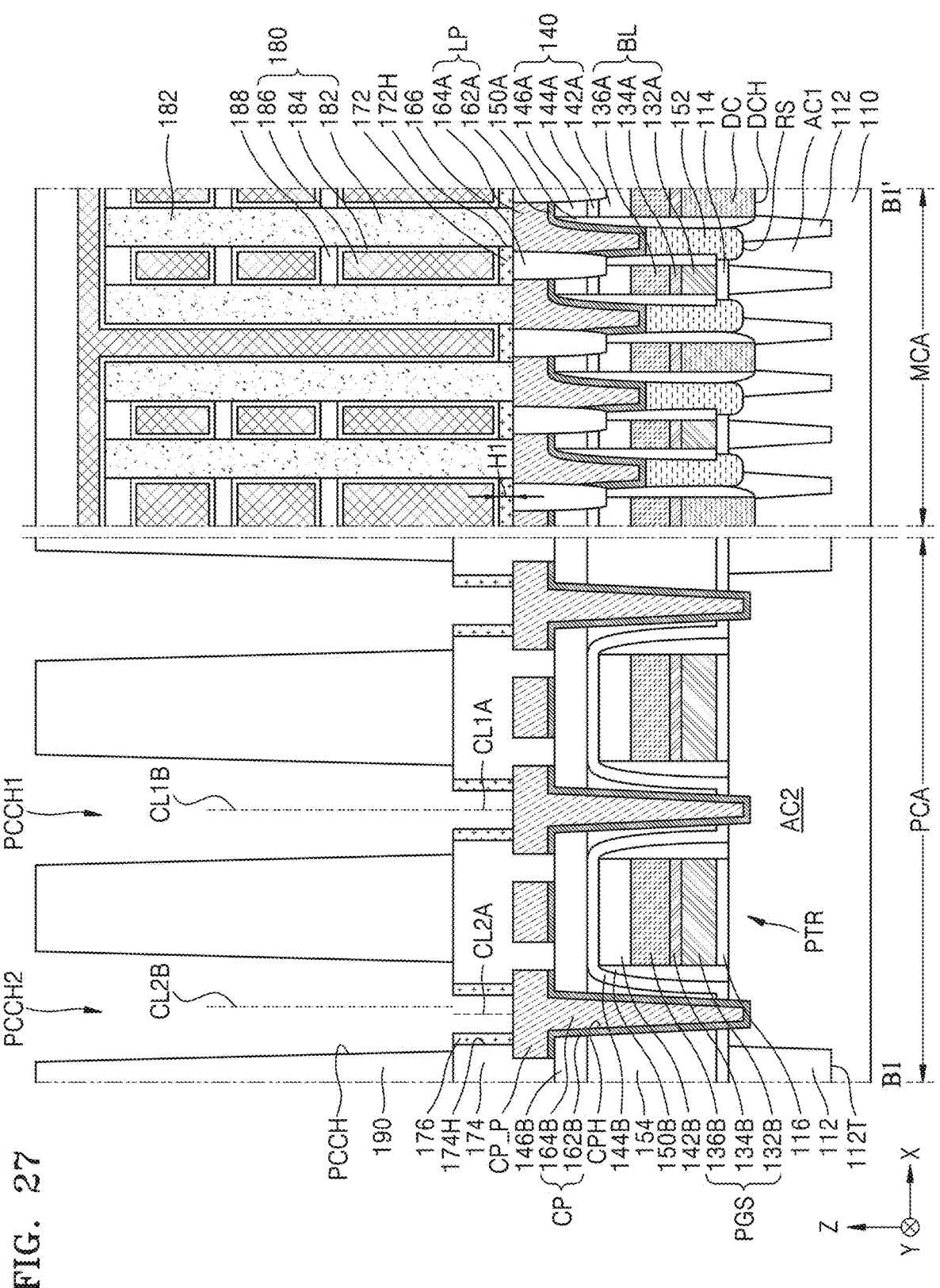

Referring to FIG. 27, a second interlayer insulation film 190 may be formed on the capacitor structure 180 and the second etch stop layer 174.

Thereafter, a mask pattern (not shown) may be formed on the second interlayer insulation film 190, and a peripheral circuit contact hole PCCH may be formed by partially removing the second interlayer insulation film 190. The peripheral circuit contact hole PCCH may pass through the second interlayer insulation film 190 and extend in the vertical direction Z, and a bottom portion of the peripheral circuit contact hole PCCH may be in communication with the bottom plug space 174H of the second etch stop layer 174.

For example, the peripheral circuit contact hole PCCH may include a first peripheral circuit contact hole PCCH1 and a second peripheral circuit contact hole PCCH2. The first peripheral circuit contact hole PCCH1 may have a central line CL1B aligned with a central line CL1A of the bottom plug space 174H. The second peripheral circuit contact hole PCCH2 may have a central line CL2B, which is apart, in the first horizontal direction X, from (e.g., misaligned with) a central line CL2A of the bottom plug space 174H.

According to this example embodiment, because the second etch stop layer 174 is formed to have a relatively large height and the bottom plug space 174H in the second etch stop layer 174 is connected to the bottom portion of the second peripheral circuit contact hole PCCH2, a relatively large horizontal or vertical distance may be secured between the second peripheral circuit contact hole PCCH2 and an adjacent contact pad CP_P even when the second peripheral circuit contact hole PCCH2 is misaligned.

Figure 28:
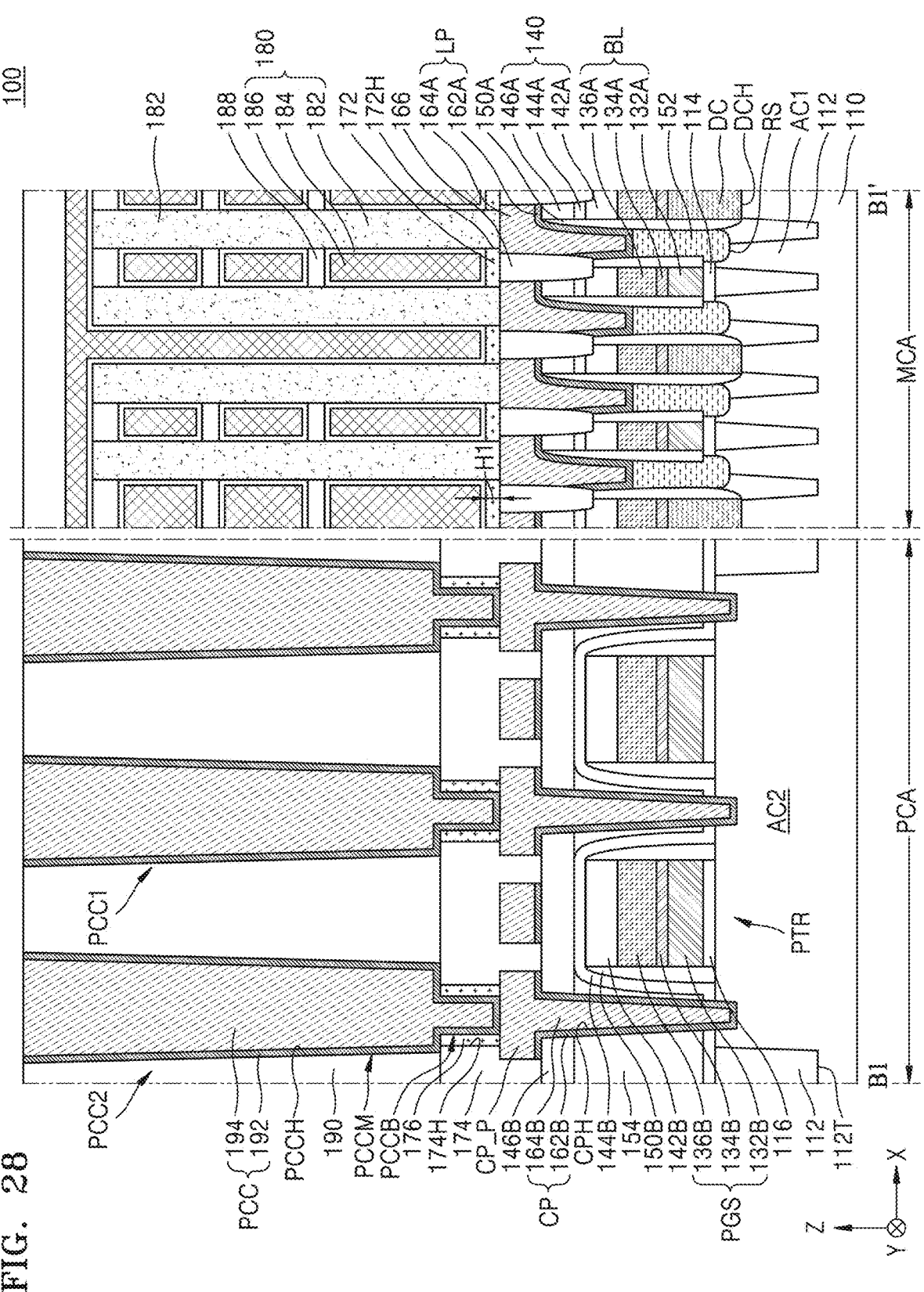

Referring to FIG. 28, a conductive barrier film 192 and a contact conductive layer 194 may be sequentially formed in the peripheral circuit contact hole PCCH, and a peripheral circuit contact PCC may be formed by removing portions of the conductive barrier film 192 and the contact conductive layer 194 until the top surface of the second interlayer insulation film 190 is exposed.

The semiconductor device 100 may be completely formed by the method described above.

According to the method described above, the bottom plug space 174H may be formed first by partially removing the second etch stop layer 174, and then the peripheral circuit contact hole PCCH may be formed to pass through the second interlayer insulation film 190 and be in communication with the bottom plug space 174H, and the peripheral circuit contact PCC may be formed in the bottom plug space 174H and the peripheral circuit contact hole PCCH. Accordingly, even when a misalignment occurs in a process of forming the peripheral circuit contact hole PCCH, an undesirable bridge defect may be mitigated or prevented from occurring between the peripheral circuit contact PCC and an adjacent contact pad CP_P.

While the inventive concepts have been particularly shown and described with reference to some example embodiments thereof, it will be understood that various changes in form and details may be made therein without departing from the spirit and scope of the following claims.

What is claimed is:

1. A semiconductor device comprising:
a substrate including a cell area and a peripheral circuit area, the peripheral circuit area being on at least one side of the cell area;
a plurality of cell transistors in the cell area;
a peripheral circuit in the peripheral circuit area, the peripheral circuit including a plurality of peripheral circuit transistors;
a first etch stop film covering the plurality of cell transistors in the cell area;
a second etch stop film above the plurality of peripheral circuit transistors in the peripheral circuit area, the second etch stop film defining a bottom plug space passing therethrough;
a capacitor structure in the cell area, the capacitor structure including a plurality of lower electrodes, the plurality of lower electrodes passing through the first etch stop film and connected to the plurality of cell transistors, respectively;
a contact structure including a contact plug and a contact pad, the contact plug extending in a vertical direction and being in contact with a source/drain area of a corresponding one of the peripheral circuit transistors, the contact pad extending horizontally from the contact plug and vertically on the corresponding one of the peripheral circuit transistors;
a peripheral circuit contact in the peripheral circuit area, the peripheral circuit contact passing through the second etch stop film and being electrically connected to the peripheral circuit; and
an insulating liner on a side wall portion of the second etch stop film defining the bottom plug space, the insulating liner surrounding at least a portion of a side wall of the peripheral circuit contact, the insulating liner on and along bottom and side boundaries of the bottom plug space,
wherein the peripheral circuit contact includes a bottom plug and a main contact portion, the bottom plug in the bottom plug space and surrounded by the insulating liner, the main contact portion extending from the bottom plug in a vertical direction,
wherein a first width of the main contact portion is greater than a second width of the bottom plug in a plan view, wherein the insulating liner is on the contact pad and is confined by the second etch stop film and the bottom plug, the second etch stop film surrounds a sidewall of the contact pad, and wherein a width of the contact pad in a horizontal direction is greater than a sum of a width of the insulating liner and a width of the bottom plug in the horizontal direction.

2. The semiconductor device of claim 1, wherein the main contact portion and the bottom plug are an integral body.

3. The semiconductor device of claim 2, wherein
the insulating liner surrounds a side wall of the bottom plug, and
at least a portion of a bottom surface of the main contact portion is on the second etch stop film.

4. The semiconductor device of claim 2, wherein the insulating liner includes a same material as the first etch stop film.

5. The semiconductor device of claim 4, wherein the insulating liner includes a material having an etch selectivity with respect to a material included in the second etch stop film.

6. The semiconductor device of claim 2, wherein the insulating liner includes a silicon boron nitride (SiBN).

7. The semiconductor device of claim 2, wherein
the bottom plug has a first central line extending in the vertical direction,
the main contact portion has a second central line extending in the vertical direction, and
the second central line is apart from the first central line in a first horizontal direction.

8. The semiconductor device of claim 7,
wherein an entirety of a bottom surface of the bottom plug is on the contact pad.

9. The semiconductor device of claim 7, wherein
each of the plurality of cell transistors includes:
a bit line structure on the substrate;
a conductive plug at a side of the bit line structure, the conductive plug being electrically connected to the substrate; and
a landing pad on the conductive plug and extending in the vertical direction, at least a portion of a top surface of the landing pad being covered with the first etch stop film, and
a corresponding one of the plurality of lower electrodes is on the landing pad.

10. The semiconductor device of claim 2, wherein a thickness of the insulating liner in a first horizontal direction is 10 angstroms to 100 angstroms.

11. The semiconductor device of claim 2, wherein
a first height of the first etch stop film in the vertical direction is 10 angstroms to 100 angstroms, and
a second height of the bottom plug in the vertical direction is 50 angstroms to 500 angstroms.

12. A semiconductor device comprising:
a substrate including a cell area and a peripheral circuit area, the peripheral circuit area on at least one side of the cell area;
a plurality of cell transistors in the cell area;
a peripheral circuit in the peripheral circuit area, the peripheral circuit including a plurality of peripheral circuit transistors;
a first etch stop film covering the plurality of cell transistors in the cell area, the first etch stop film having a first height in a vertical direction perpendicular to a top surface of the substrate;

a second etch stop film above the plurality of peripheral circuit transistors in the peripheral circuit area, a side wall portion of the second etch stop film defining a bottom plug space passing therethrough;
a capacitor structure in the cell area, the capacitor structure including a plurality of lower electrodes passing through the first etch stop film and connected to the plurality of cell transistors, respectively;
a contact structure including a contact plug and a contact pad, the contact plug extending in a vertical direction and being in contact with a source/drain area of a corresponding one of the peripheral circuit transistors, the contact pad extending horizontally from the contact plug and vertically on the corresponding one of the peripheral circuit transistors;
a peripheral circuit contact in the peripheral circuit area, the peripheral circuit contact passing through the second etch stop film, the peripheral circuit contact being electrically connected to the peripheral circuit, the peripheral circuit contact including a main contact portion and a bottom plug connected to a bottom portion of the main contact portion; and
an insulating liner surrounding a side wall of the bottom plug, the insulating liner being on the side wall portion of the second etch stop film that defines the bottom plug space, the insulating liner being on and along bottom and side boundaries of the bottom plug space, and
wherein the bottom plug has a second height in the vertical direction, the second height being greater than the first height,
wherein the bottom plug is in the bottom plug space and surrounded by the insulating liner, and the main contact portion extends from the bottom plug in the vertical direction,
wherein a first width of the main contact portion is greater than a second width of the bottom plug in a plan view,
wherein the insulating liner is on the contact pad and is confined by the second etch stop film and the bottom plug, the second etch stop film surrounds a sidewall of the contact pad, and
wherein a width of the contact pad in a horizontal direction is greater than a sum of a width of the insulating liner and a width of the bottom plug in the horizontal direction.

13. The semiconductor device of claim 12, wherein
the bottom plug fills the bottom plug space.

14. The semiconductor device of claim 12, wherein
the main contact portion and the bottom plug are an integral body.

15. The semiconductor device of claim 14, wherein
the bottom plug has a first central line extending in the vertical direction,
the main contact portion has a second central line extending in the vertical direction, and
the first central line is apart from the second central line in a first horizontal direction.

16. The semiconductor device of claim 12, wherein at least a portion of a bottom surface of the main contact portion contacts a top surface of the second etch stop film.

17. The semiconductor device of claim 12, wherein
the insulating liner includes a same material as a material included in the first etch stop film, and
the insulating liner includes a silicon boron nitride (SiBN).

18. The semiconductor device of claim 12,
wherein an entirety of a bottom surface of the bottom plug is on the contact pad.

19. The semiconductor device of claim 18, wherein each of the plurality of cell transistors includes:

a bit line structure on the substrate;

a conductive plug at a side of the bit line structure, the conductive plug being electrically connected to the substrate; and a landing pad on the conductive plug and extending in the vertical direction, at least a portion of a top surface of the landing pad being covered with the first etch stop film, and a corresponding one of the plurality of lower electrodes is on the landing pad.

20. A semiconductor device comprising:

a substrate including a cell area and a peripheral circuit area, the peripheral circuit area being on at least one side of the cell area;

a bit line structure in the cell area;

a conductive plug at a side of the bit line structure, the conductive plug being electrically connected to the substrate;

a landing pad on the conductive plug, the landing pad extending in a vertical direction, the vertical direction being perpendicular to a top surface of the substrate;

a first etch stop film covering the landing pad in the cell area;

a lower electrode in the cell area of the substrate, the lower electrode passing through the first etch stop film, connected to the landing pad, and extending in the vertical direction;

a peripheral circuit in the peripheral circuit area, the peripheral circuit including a plurality of peripheral circuit transistors;

a contact plug in the peripheral circuit area, extending in a vertical direction, and being in contact with a source/drain area of a corresponding one of the peripheral circuit transistors, a contact pad in the peripheral circuit area, extending horizontally from the contact plug, being vertically on the corresponding one of the peripheral circuit transistors, electrically connected to the peripheral circuit;

a second etch stop film covering the contact pad in the peripheral circuit area, the second etch stop film above the plurality of peripheral circuit transistors in the peripheral circuit area;

a peripheral circuit contact in the peripheral circuit area, the peripheral circuit contact passing through the second etch stop film, the peripheral circuit contact being electrically connected to the peripheral circuit, the peripheral circuit contact including a main contact portion and a bottom plug, the bottom plug connected to a bottom portion of the main contact portion; and an insulating liner surrounding a side wall of the bottom plug, the insulating liner being on a side wall portion of the second etch stop film that defines a bottom plug space, the insulating liner being on and along bottom and side boundaries of the bottom plug space, wherein the bottom plug is in the bottom plug space and surrounded by the insulating liner, and the main contact portion extends from the bottom plug in the vertical direction, wherein a first width of the main contact portion is greater than a second width of the bottom plug in a plan view, wherein the insulating liner is on the contact pad and is confined by the second etch stop film and the bottom plug, the second etch stop film surrounds a sidewall of the contact pad, and wherein a width of the contact pad in a horizontal direction is greater than a sum of a width of the insulating liner and a width of the bottom plug in the horizontal direction.

* * * * *